United States Patent [19]
Kohyama

[11] Patent Number: 5,616,961
[45] Date of Patent: Apr. 1, 1997

[54] STRUCTURE OF CONTACT BETWEEN WIRING LAYERS IN SEMICONDUCTOR INTEGRATED CIRCUIT DEVICE

[75] Inventor: Yusuke Kohyama, Yokosuka, Japan

[73] Assignee: Kabushiki Kaisha Toshiba, Kawasaki, Japan

[21] Appl. No.: 391,516

[22] Filed: Feb. 21, 1995

[30] Foreign Application Priority Data

Mar. 3, 1994 [JP] Japan .................................. 6-033683

[51] Int. Cl.$^6$ ........................... H01L 23/48; H01L 23/52; H01L 29/40; H01L 23/28
[52] U.S. Cl. ........................ 257/774; 257/758; 257/775; 257/776
[58] Field of Search .................................. 257/734, 758, 257/759, 774, 775, 776

[56] References Cited

U.S. PATENT DOCUMENTS

| 4,916,521 | 4/1990 | Kohyama | 257/774 |
| 5,200,030 | 4/1993 | Cho et al. | 156/657 |
| 5,256,564 | 10/1993 | Narita | 437/195 |

FOREIGN PATENT DOCUMENTS

| 0002185 | 6/1979 | European Pat. Off. . |
| 0124181 | 11/1984 | European Pat. Off. . |
| 2-57707 | 3/1990 | Japan . |
| 1-302751 | 2/1991 | Japan . |
| 64-45141 | 1/1992 | Japan . |

OTHER PUBLICATIONS

Nesbit et al., A. 0.6um$^2$ 256 Mb Trench DRAM Cell With Self-Aligned BuriEd STrap (BEST), IEDM 93, 627–630 no date.

van Dijk et al., "A Two-Level Metallization System with Oversized Vias and a Ti:W Etch Barrier", IEEE VLSI Multilevel Interconnection Conference, Santa Clara Jun. 25–26, 1985, pp. 123–130.

Moriya, et al., "A Planar Metallization Process—Its Application to Tri-Level Aluminum Interconnection", IEDM 83, pp. 550–553 no date.

Primary Examiner—Carl Whitehead, Jr.
Attorney, Agent, or Firm—Banner & Witcoff, Ltd.

[57] ABSTRACT

An insulation film is interposed between a first-level wiring layer and a second-level wiring layer. A contact hole is formed in the insulation film on the first-level wiring layer to electrically connect the first-level wiring layer and second-level wiring layer. The contact hole is larger than the width of the first-level wiring layer and second-level wiring layer. The second-level wiring layer is formed on a side wall and a bottom portion of the contact hole and electrically connected to the first-level wiring layer.

37 Claims, 20 Drawing Sheets

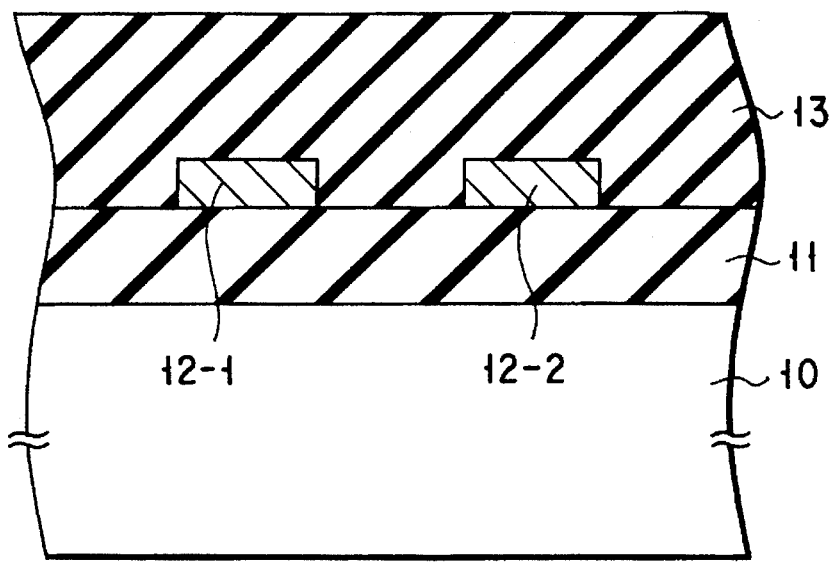
F I G. 6A
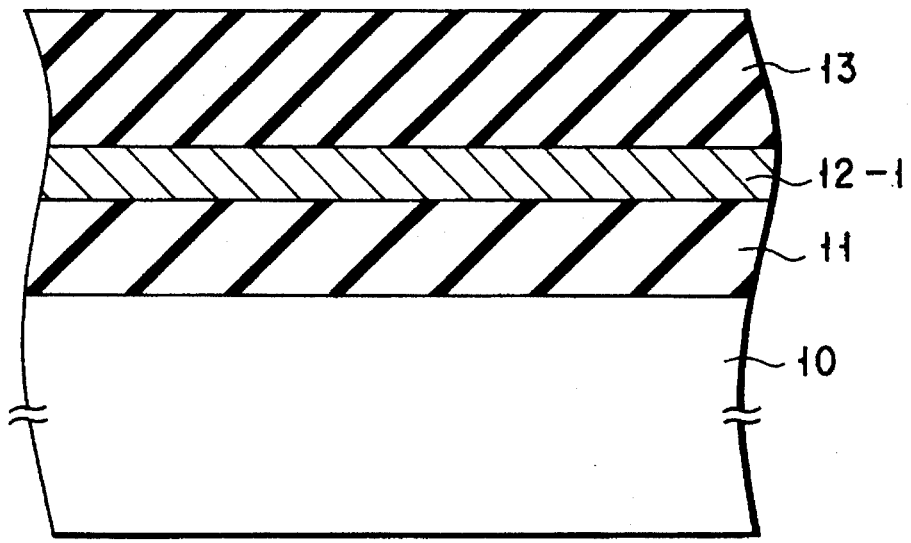
F I G. 6B

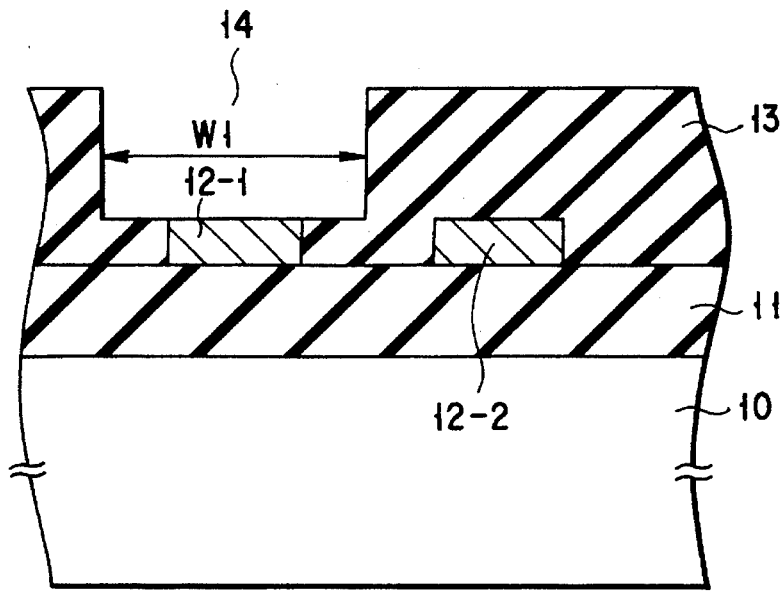
F I G. 7A
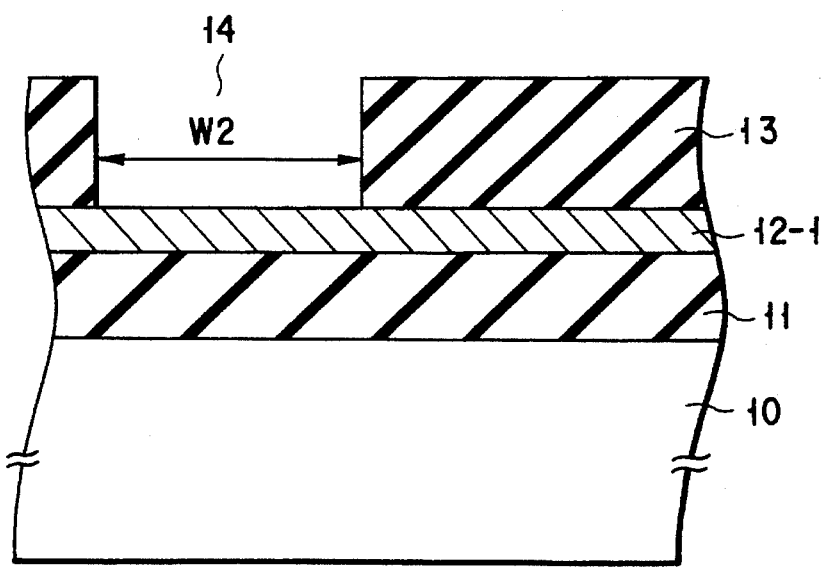
F I G. 7B

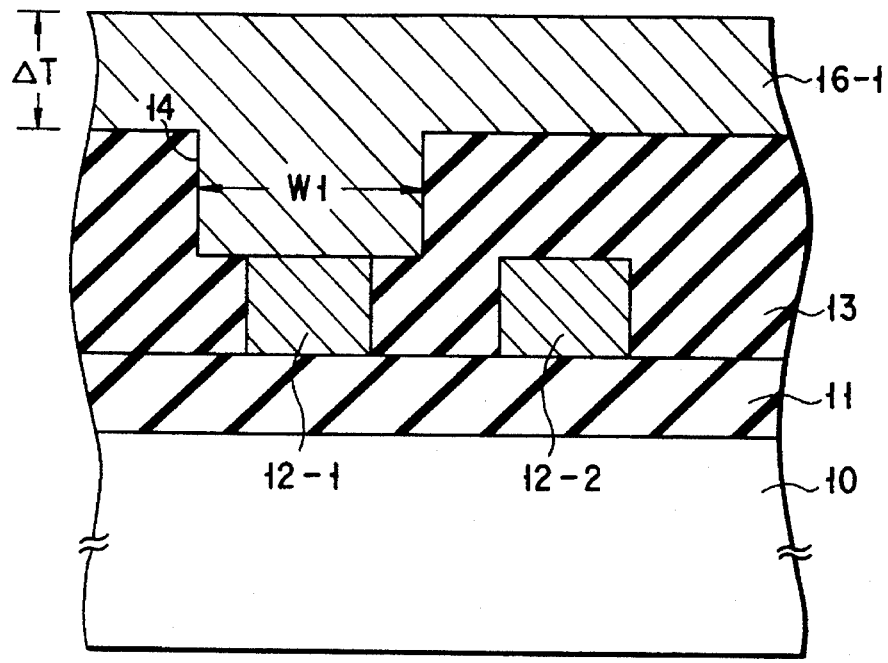
F I G. 15A
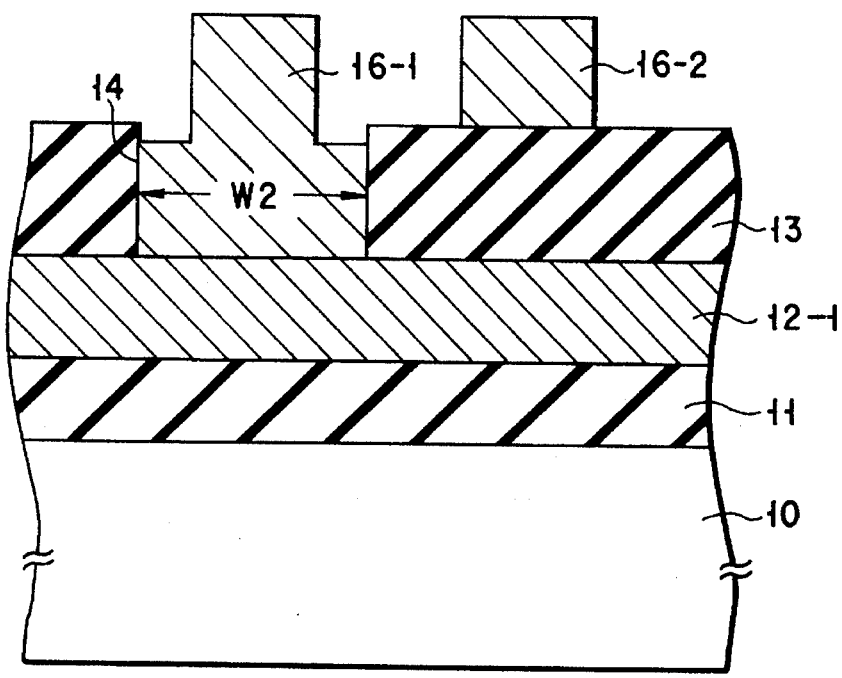
F I G. 15B

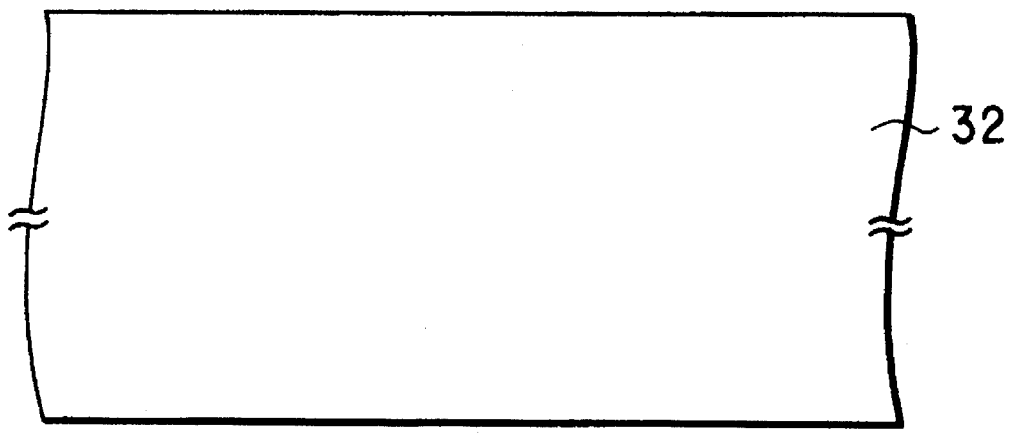
F I G. 17A
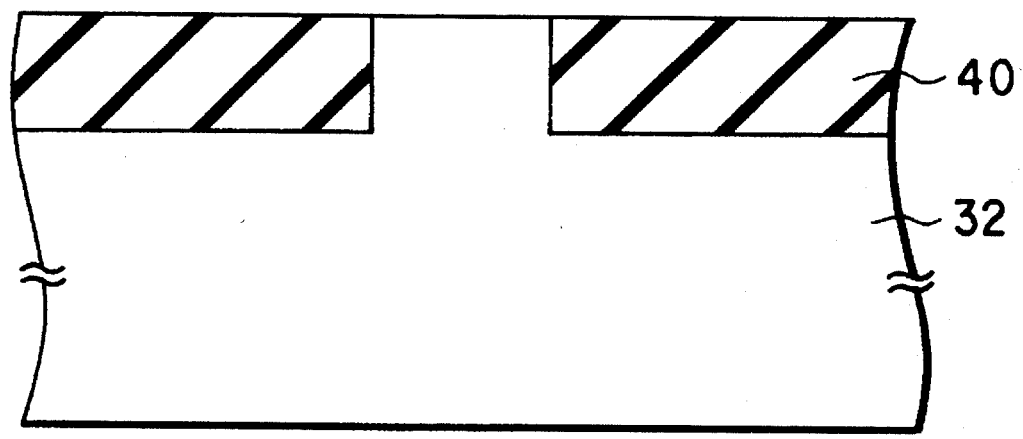
F I G. 17B

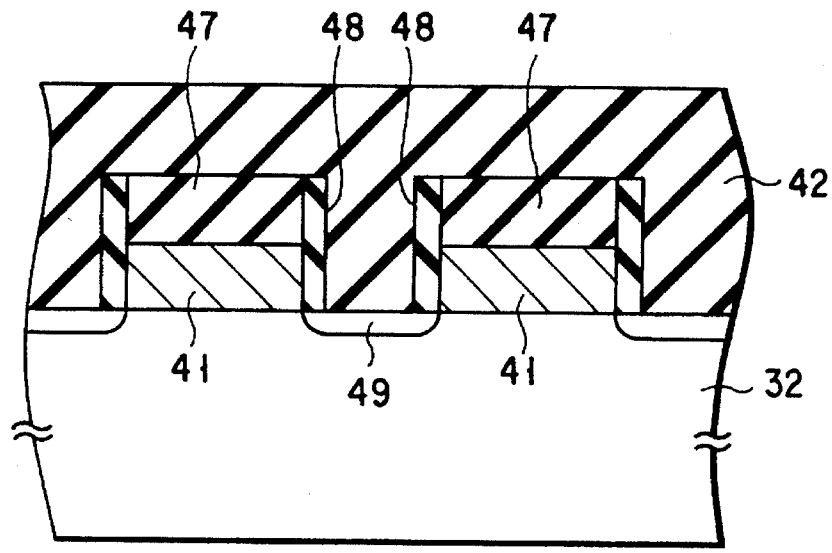
F I G. 18A
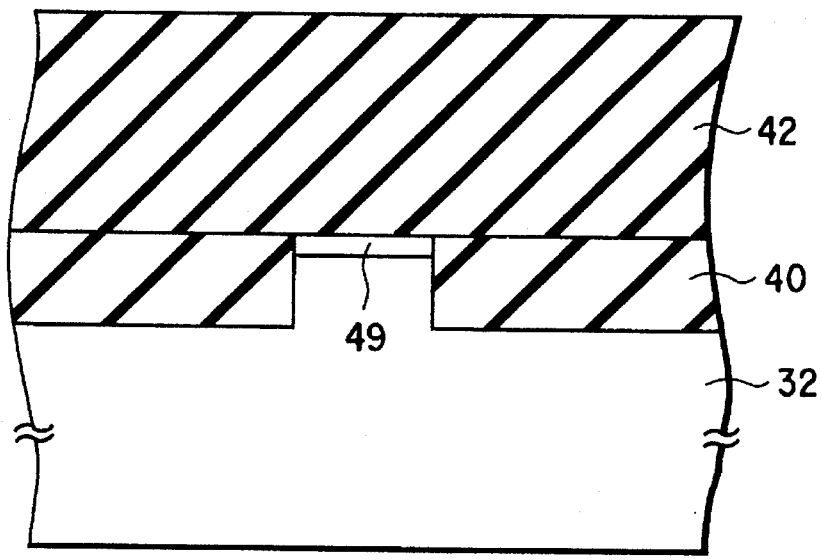
F I G. 18B

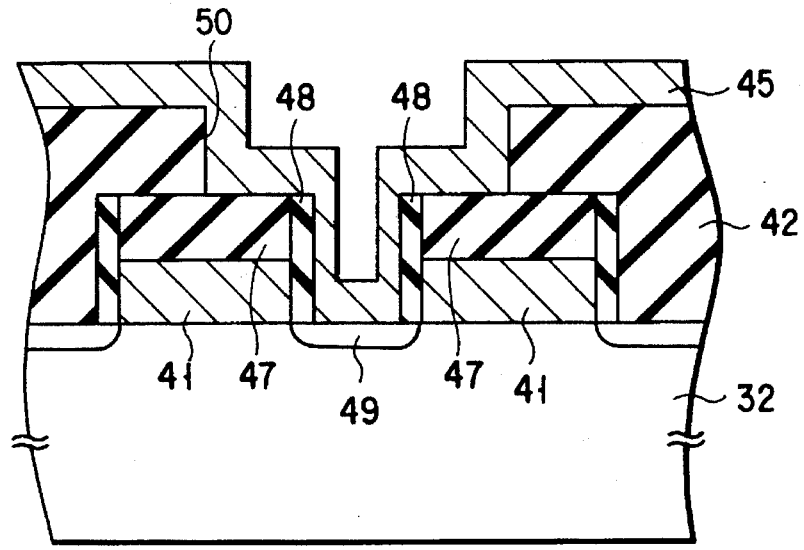
F I G. 19A
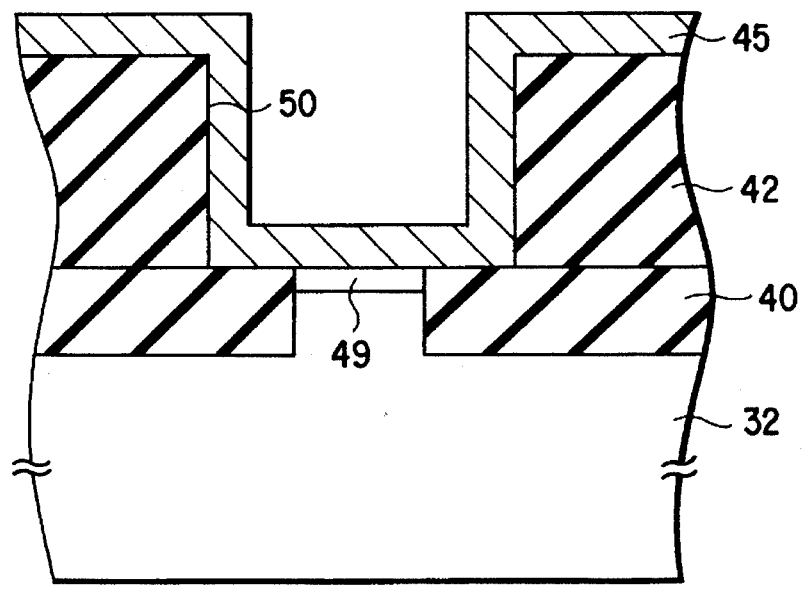
F I G. 19B

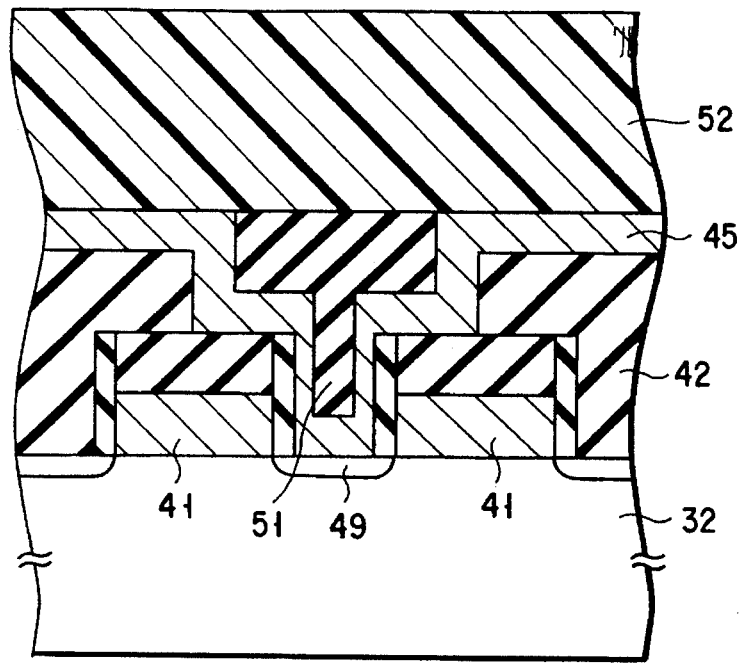
F I G. 20A
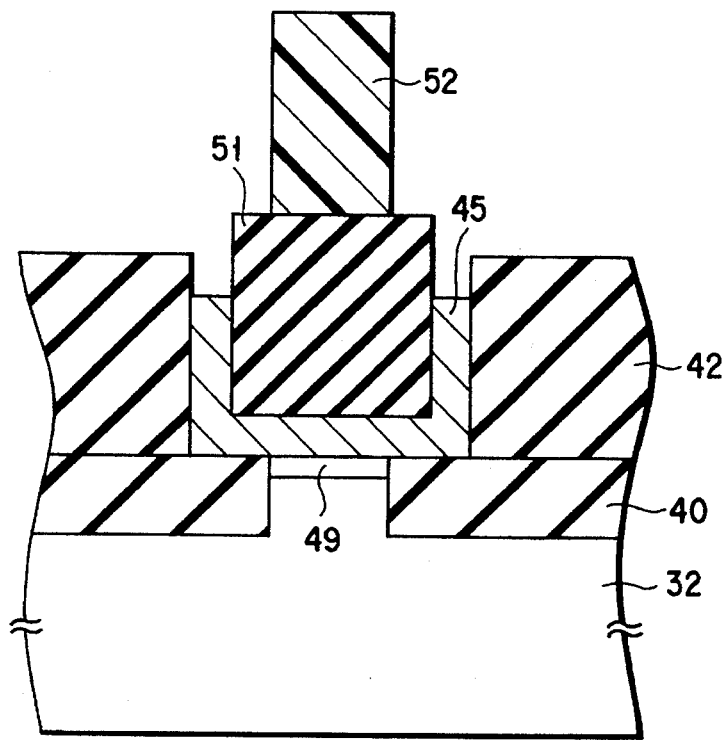
F I G. 20B

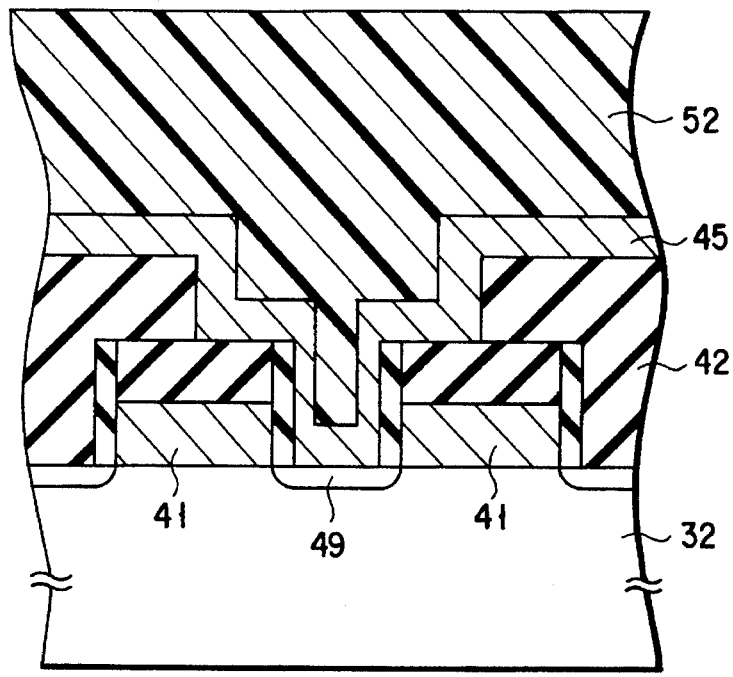
F I G. 21A
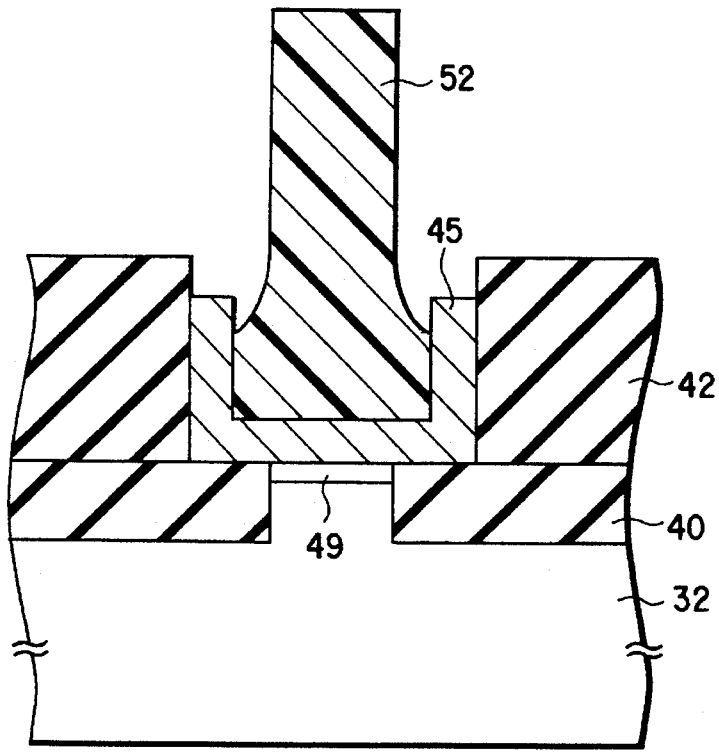
F I G. 21B

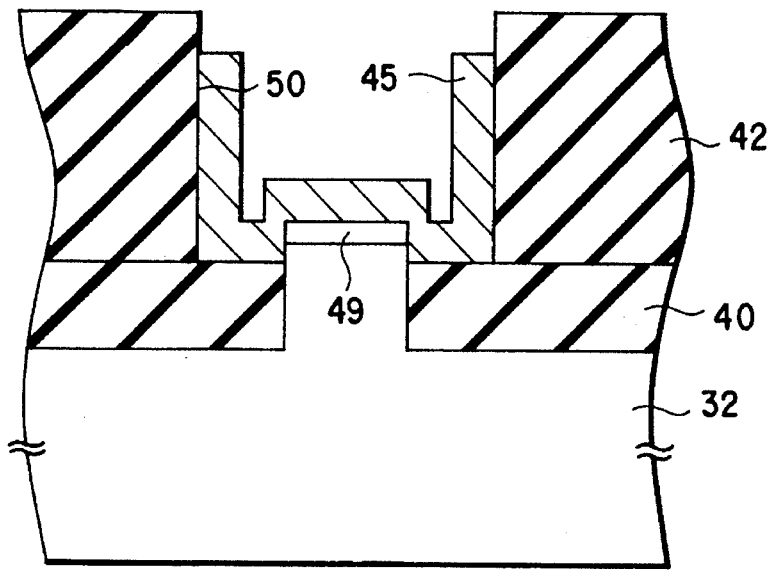
F I G. 22
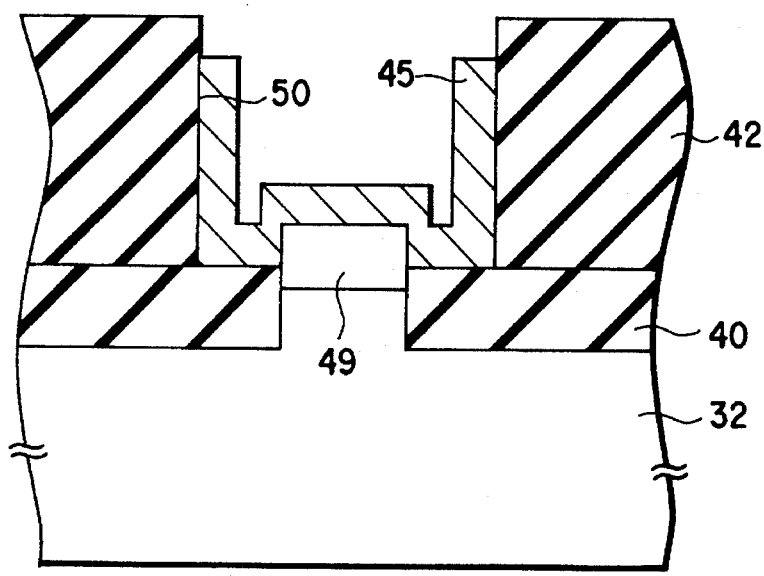
F I G. 23

STRUCTURE OF CONTACT BETWEEN WIRING LAYERS IN SEMICONDUCTOR INTEGRATED CIRCUIT DEVICE

BACKGROUND OF THE INVENTION

1. Field of the Invention

The present invention relates to a semiconductor device and a method for manufacturing the same and, more specifically, to a structure of contact between wiring layers in a semiconductor integrated circuit device manufactured at a high degree of integration and a method for forming the contact.

2. Description of the Related Art

A prior art structure of contact between wiring layers in a semiconductor integrated circuit device and a prior art method of forming the contact are described in, for example, IEDM 83, pp. 530–553 "A PLANAR METALLIZATION PROCESS—ITS APPLICATION TO TRI-LEVEL ALUMINUM INTERCONNECTION" Moriya et al., and Jpn. Pat. Appln. KOKOKU Publication No. 2-57707.

FIG. 1 is a pattern plan view showing a conventional contact portion of a semiconductor integrated circuit device, and FIG. 2 is a cross-sectional view taken along the line 2—2 of FIG. 1. As shown in FIGS. 1 and 2, an insulation film 101 such as a field oxide film is provided on a semiconductor substrate 100 constituted by silicon or the like. First-level wiring layers 102-1 and 102-2 are formed in the first direction on the insulation film 101. An insulation film 103 of BPSG or the like is provided on the insulation film 101 and wiring layers 102-1 and 102-2. A contact hole 104 is formed in the insulation film 103 located on the wiring layer 102-1 and filled with a conductive filler 105 such as tungsten. Second-level wiring layers 106-1 and 106-2 are provided on the insulation film 103 in the second direction perpendicular to the first direction. The first-level wiring layer 102-1 and the second-level wiring layer 106-1 are electrically connected to each other by the conductive filler 105. The regions around the contact portion of the wiring layers 102-1 and 106-1 are formed widely in order to prevent failed connections due to mask displacement at the time of forming the contact hole 104.

The foregoing contact portion is formed through the following steps. First an insulation film 101 is formed on a semiconductor substrate 100. If the insulation film 101 is a field oxide film, it is obtained by selectively oxidizing the major surface of the substrate 100 by, e.g., LOCOS. Secondly polysilicon or the like is deposited on the insulation film 101 to form first-level wiring layers 102-1 and 102-2 by patterning. An insulation film 103 is then formed on the resultant structure and its surface is planarized by reflow, CMP (Chemical Mechanical Polishing), or the like. After that, a contact hole 104 is formed in the insulation film 103 on the wiring layer 102-1 by anisotropic etching such as RIE. Tungsten, or the like is selectively grown on the wiring layer 102-1 in the contact hole 104 by LPCVD, or a conductive layer is formed on the entire surface of the insulation film 103 and etched back to leave it in the contact hole 104, with the result that the hole 104 is filled with a conductive filler 105. Finally tungsten, aluminum, or the like is deposited on the insulation film 103 by CVD, sputtering, etc. to form second-level wiring layers 106-1 and 106-2 by patterning.

However, according to the structure of the contact portion and the method of forming the same, as described above, the first-level and second-level wiring layers require a margin Δα for mask alignment at each contact portion between the wiring layers. Assuming that the minimum dimension determined according to a design rule is D, the width of each wiring layer is D, the interval between the wiring layers is D+Δα, and the wiring pitch is 2D+Δα which is an index of degree of integration. This margin Δα is a hindrance to high degree of integration.

SUMMARY OF THE INVENTION

A first object of the present invention is to provide a semiconductor device having a contact portion between wiring layers which is favorable for high degree of integration.

A second object of the present invention is to provide a semiconductor device having a contact portion which requires no mask alignment margin and allows an interval between wiring layers to be set to the minimum according to a design rule.

A third object of the present invention is to provide a method for manufacturing a semiconductor device having a contact portion between wiring layers which is favorable for high degree of integration.

A fourth object of the present invention is to provide a method for manufacturing a semiconductor device having a contact portion which requires no mask alignment margin and allows an interval between wiring layers to be set to the minimum according to a design rule.

The above first and second objects are attained by a semiconductor device comprising:

a first-level wiring layer;

a second-level wiring layer;

an insulation film interposed between the first-and second-level wiring layers; and a contact hole formed in the insulation film at an overlap portion of the first- and second-level wiring layers, to a depth reaching the upper surface of the first-level wiring layer, the contact hole being broader than the first-level wiring layer and the second-level wiring layer, and the second-level wiring layer being formed at least on a side wall and a bottom portion of the contact hole, thereby electrically connecting the second-level wiring layer to the first-level wiring layer at the bottom portion of the contact hole.

Since the constitution of the semiconductor device described above does not need a margin for preventing a fail contact due to mask displacement at the contact portion of the first- and second-level wiring layers, high degree of integration can be achieved.

The above third and fourth objects are attained by a method of manufacturing a semiconductor device, comprising the steps of:

forming a first-level wiring layer;

forming a first insulation film coating the first-level wiring layer;

forming a contact hole in the first insulation film to a depth reaching the upper surface of the first-level wiring layer, the contact hole being larger than a width of the first-level wiring layer;

providing a second-level wiring material on a resultant structure;

burying a second insulation film in the contact hole;

forming photoresist having a width which is smaller than the diameter of the contact hole; and patterning the second-level wiring material using the photoresist and the second insulation film as masks thereby to form a second-level wiring layer.

According to the foregoing manufacturing method, in patterning the first- and second-level wiring layers, they need not be provided with a margin for mask alignment but can be patterned with the minimum width and at the minimum intervals determined according to a design rule, thus improving in high degree of integration.

Consequently, according to the present invention, a semiconductor device having a contact portion between wiring layers favorable for high degree of integration and a method of manufacturing the same, can be provided. Furthermore, a semiconductor device which requires no mask alignment margin and allows the dimension of a contact portion to be set to the minimum according to a design rule, can be provided.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIGS. 6A, 7A, 8A and 9A are cross-sectional views taken along the line 5A—5A of FIG. 4, showing the steps of forming the contact portions shown in FIGS. 3, 4, 5A and 5B;

FIGS. 6B, 7B, 8B and 9B are cross-sectional views taken along the line 5B—5B of FIG. 4, showing the steps of forming the contact portions shown in FIGS. 3, 4, 5A and 5B;

FIG. 15A is a cross-sectional view taken along the line 14A—14A of FIG. 13 and showing another process of manufacturing the semiconductor device of the second embodiment;

FIG. 15B is a cross-sectional view taken along the line 14B—14B of FIG. 13 and showing another process of manufacturing the semiconductor device of the second embodiment;

FIGS. 17A, 18A, 19A and 20A are cross-sectional views taken along the line 17A—17A of FIG. 16A and showing steps of forming the bit-line contact portion of the DRAM shown in FIGS. 16A, 16B and 16C;

FIGS. 17B, 18B, 19B and 20B are cross-sectional views taken along the line 17B—17B of FIG. 16A and showing steps of forming the bit-line contact portion of the DRAM shown in FIGS. 16A, 16B and 16C;

FIG. 21A is a cross-sectional view taken along the line 17A—17A of FIG. 16A and showing a step of forming part of the bit-line contact portion of the DRAM, for explaining another example (fourth embodiment) wherein the present invention is applied to the bit-line contact portion;

FIG. 21B is a cross-sectional view taken along the line 17B—17B of FIG. 16A and showing a step of forming part of the bit-line contact portion of the DRAM, for explaining another example (fourth embodiment) wherein the present invention is applied to the bit-line contact portion;

FIG. 22 is a cross-sectional view of the bit-line contact portion which is over-etched in the step shown in FIG. 19B;

FIG. 23 is a cross-sectional view showing a constitution of a semiconductor device according to a fifth embodiment of the present invention, which prevents a short circuit from being caused between a bit line and a P well region shown in FIG. 22.

DETAILED DESCRIPTION OF THE PREFERRED EMBODIMENTS

Figure 3:
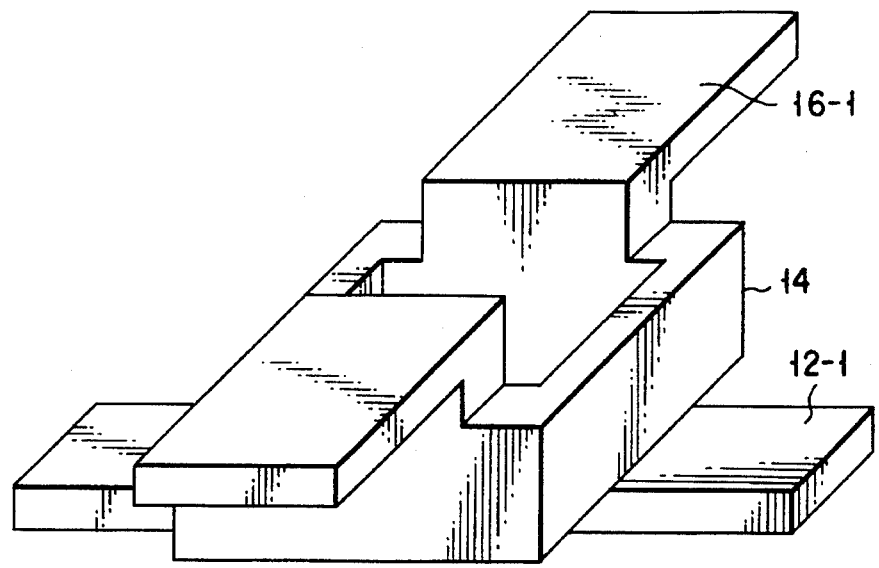
FIG. 3 is a perspective view of a contact portion between a first-level wiring layer and a second-level wiring layer of a semiconductor integrated circuit device according to a first embodiment of the present invention.
Figure 4:
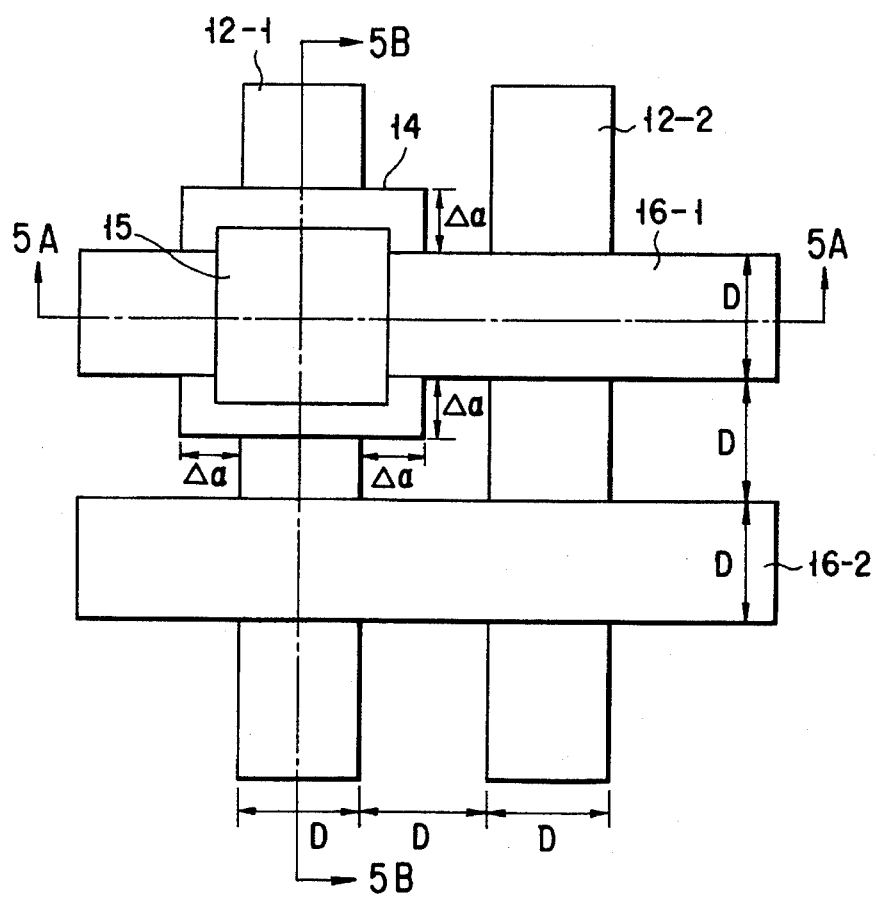
FIG. 4 is a pattern plan view of the contact portion of the semiconductor device according to the first embodiment of the present invention.
Figure 5A:
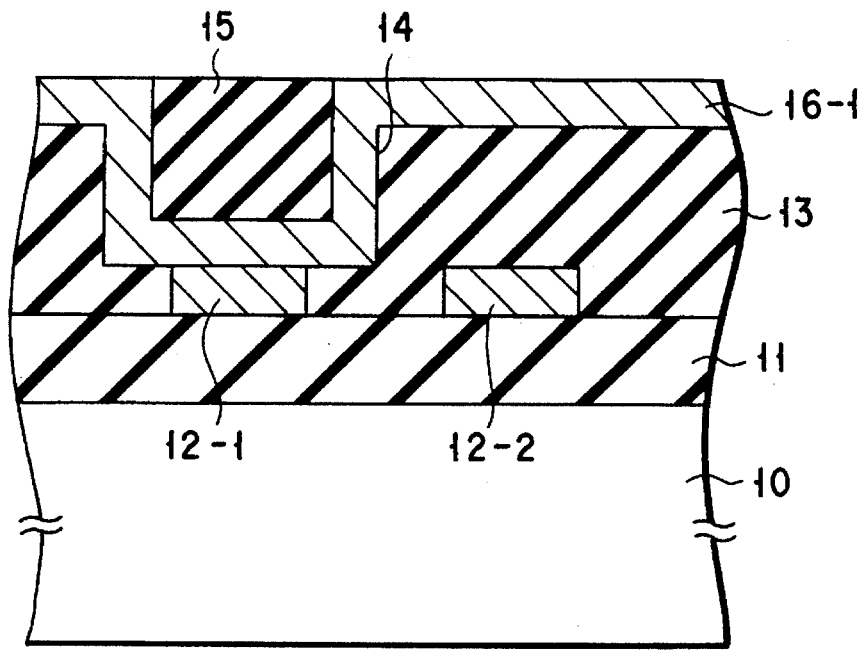
FIG. 5A is a cross-sectional view taken along the line 5A—5A of FIG. 4.
Figure 5B:
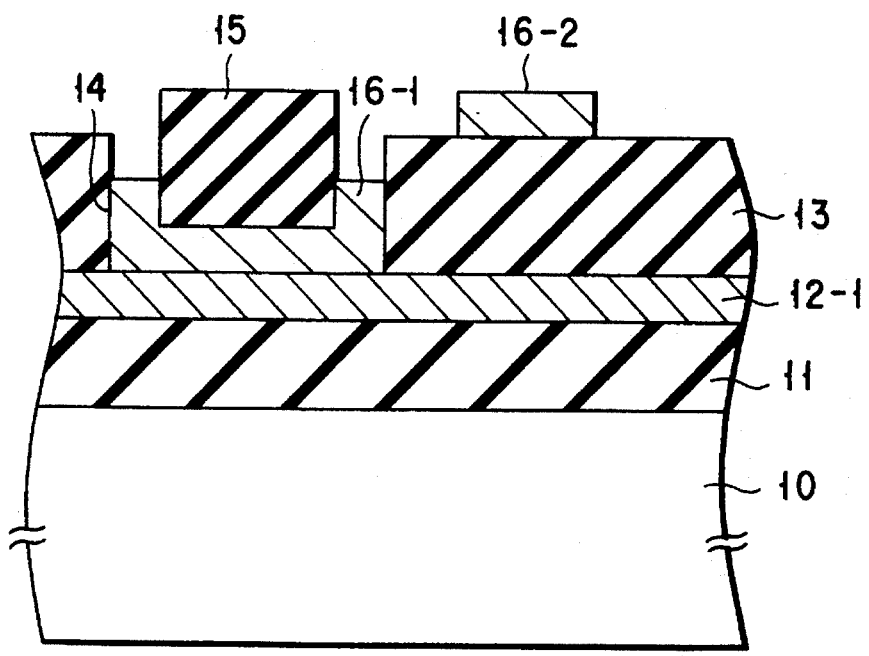
FIG. 5B is a cross-sectional view taken along the line 5B—5B of FIG. 4.

FIGS. 3, 4, 5A and 5B are views for explaining a semiconductor device according to a first embodiment of the present invention. FIG. 3 is a perspective view showing a constitution of a contact portion between first-level and second-level wiring layers of the semiconductor device, FIG. 4 is a pattern plan view of the contact portion, FIG. 5A is a cross-sectional view taken along the line 5A—5A of FIG. 4, and FIG. 5B is a cross-sectional view taken along the line 5B—5B of FIG. 4. As shown in these figures, the contact portion is formed at a right-angled intersection of the first- and second-level wiring layers.

As illustrated in FIGS. 4, 5A and 5B, an insulation film 11 such as a field oxide film is provided on a semiconductor substrate 10 constituted of silicon or the like. First-level wiring layers 12-1 and 12-2 are formed in the first direction on the insulation film 11. An insulation film 13 constituted of BPSG or the like is provided on the insulation film 11 and wiring layers 12-1 and 12-2. A contact hole 14 is formed in the insulation film on the wiring layer 12-1 to a depth reaching the upper surface of the wiring layer 12-1. A second-level wiring layer 16-1 is formed on the bottom and side wall portions of the contact hole 14, and the contact hole 14 is filled with an insulative filler 15 of SOG (Spin On Glass) or the like. The second-level wiring layers 16-1 and 16-2 are formed on the insulation film 13 in the second direction perpendicular to the first direction.

As illustrated in FIGS. 3, 4, 5A and 5B, the second-level wiring layer 16-1 extends from the bottom and side wall portions of the contact hole 14 onto the insulation film 13 and contacts the first-level wiring layer 12-1 at the bottom portion of the hole 14, with the result that the first- and second-level wiring layers 12-1 and 16-1 are electrically connected to each other. The contact hole 14 is provided with a mask alignment margin $\Delta\alpha$ in order to prevent bad connection due to mask displacement. If the width of each of the wiring layers 12-1, 12-2, 16-1 and 16-2 is D, each side of the contact hole is given by $D+2\Delta\alpha$.

Figure 1:
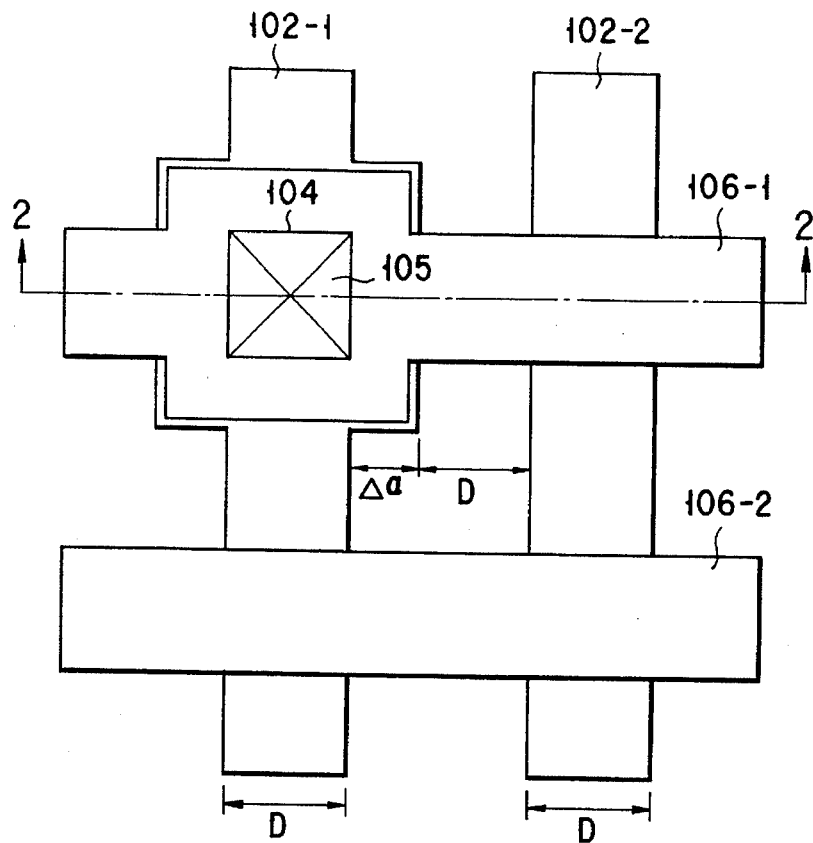
FIG. 1 is a pattern plan view of a contact portion of a semiconductor integrated circuit device, for explaining a prior art contact portion between wiring layers and a method of forming the same.
Figure 2:
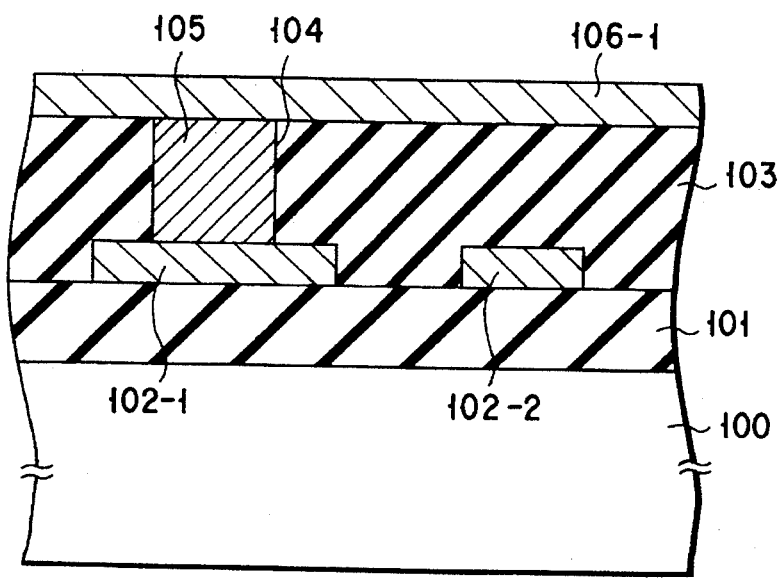
FIG. 2 is a cross-sectional view taken along the line 2—2 of FIG. 1.

With the above constitution, the width of each of the wiring layers 12-1, 12-2, 16-1 and 16-2 and the interval between them are represented by the minimum dimension D determined according to the design rule. Therefore, neither the wiring layer 12-1 nor 16-1 requires the alignment margin $\Delta\alpha$, and the wiring pitch is 2D, with the result that a contact portion suitable for high degree of integration can be formed between the wiring layers. In the constitution shown in FIGS. 3, 4, 5A and 5B, the mask alignment margin $\Delta\alpha$ is required for the contact hole 14, and the alignment margin $\Delta\alpha$ as well as the minimum dimension D is required for an interval between the contact hole 14 and its adjacent one (not shown). In this respect, the constitution is the same as that of FIGS. 1 and 2.

A method of forming the above-described contact portion will now be described in detail, with reference to FIGS. 6A through 9B. FIGS. 6A, 7A, 8A and 9A are cross-sectional views taken along the line 5A—5A of FIG. 4 and showing the steps of forming the contact portion having the structure shown in FIG. 5A, while FIGS. 6B, 7B, 8B and 9B are cross-sectional views taken along the line 5B—5B of FIG. 4 and showing the steps of forming the contact portion having the structure shown in FIG. 5B.

As illustrated in FIGS. 6A and 6B, an insulation film 11 is formed on a semiconductor substrate 10. If the insulation film 11 is a field oxide film, the surface of the substrate 10 is selectively oxidized by, e.g., LOCOS. A conductive layer constituted of polysilicon or the like is deposited on the insulation film 11 to form first-level wiring layers 12-1 and 12-2 by patterning. An insulation film 13 is then formed on the resultant structure and its surface is planarized by reflow, CMP, or the like.

After that, as shown in FIGS. 7A and 7B, a contact hole 14 is formed in the insulation film 13 on the wiring layer 12-1 by anisotropic etching such as RIE. The contact hole 14 is formed to a depth reaching the upper surface of the wiring layer 12-1, and its sides each have margins $\Delta\alpha$ on the right and left with respect to the width D of each of the wiring layers 12-1, 12-2, 16-1 and 16-2 in order to prevent fail contact due to mask displacement. More specifically, the width W1 of each of two sides of the hole 14, which intersect the first-level wiring layer 12-1, is greater than the width D1 of the layer 12-1 by $2\Delta\alpha$, and the width D2 of each of two sides of the hole 14, which intersect the second-level wiring layer 16-1, is greater than the width D of the layer 16-1 by $\Delta\alpha$.

Figure 8A:
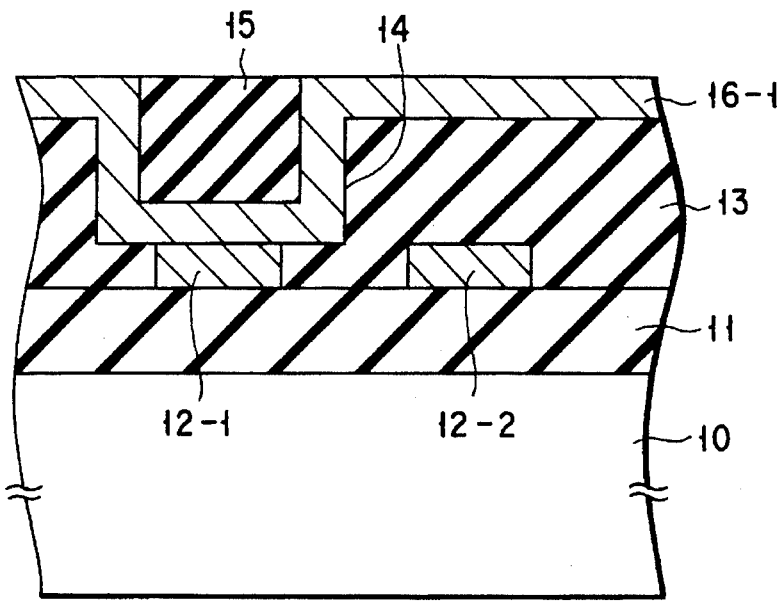
Figure 8B:
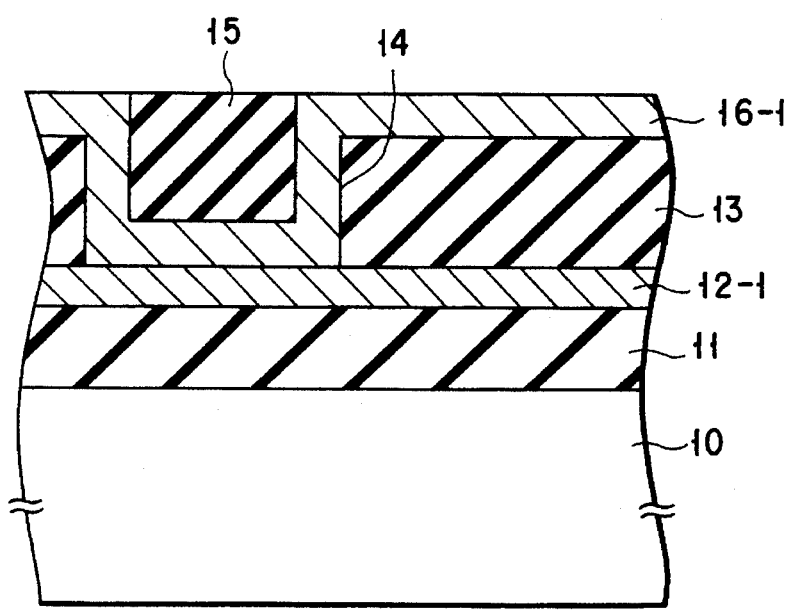

Thereafter, a conductive layer of tungsten or the like is formed on the resultant structure by CVD, and the contact hole 14 is filled with an insulative filler 15 of SOG, etc., thereby completing the contact structure shown in FIGS. 8A and 8B.

Figure 9A:
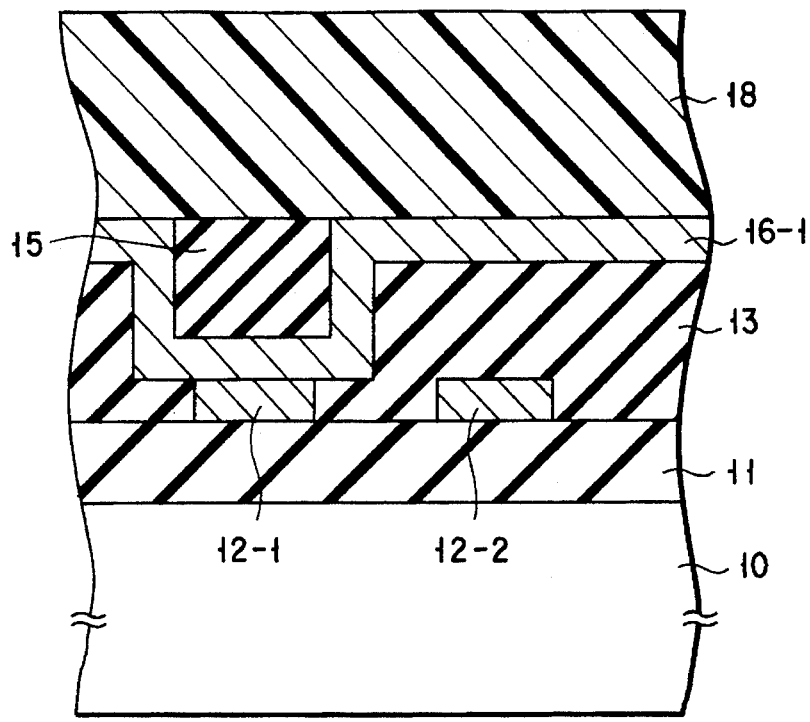
Figure 9B:
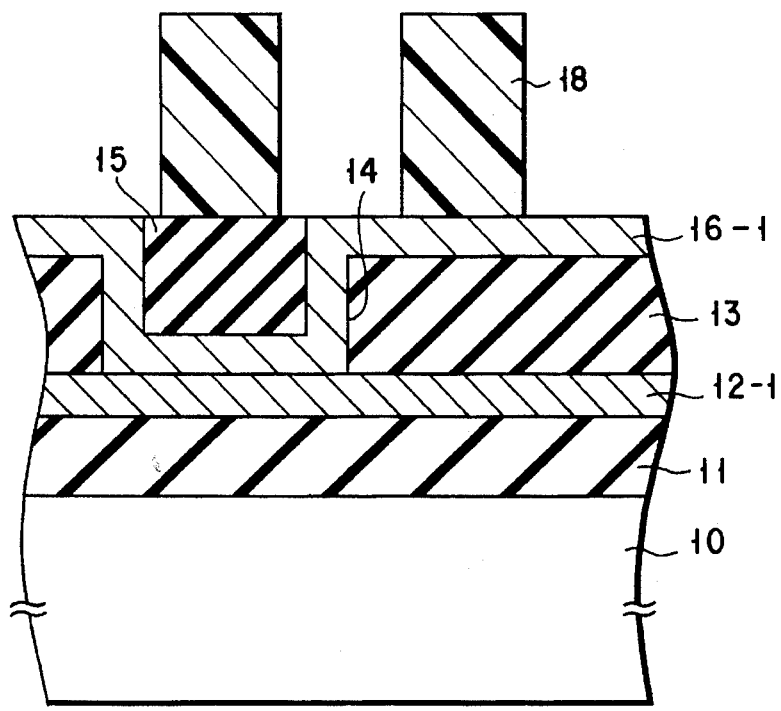

As shown in FIGS. 9A and 9B, photoresist 18 is applied onto the insulation film 13, wiring layers 16-1 and 16-2, and insulative filler 15, and treatment such as exposure and development is carried out to form a mask for patterning. Using this mask, the conductive layer is patterned by anisotropic etching such as RIE to form second-level wiring layers 16-1 and 16-2. Consequently, the contact structure is obtained as shown in FIGS. 4, 5A and 5B.

According to the method described above, when the contact hole is formed in the insulation film 13 on the first-level wiring layer 12-1, if mask displacement falls within a range of $\pm\Delta\alpha$, reliable contact can be obtained between the first- and second-level wiring layers 12-1 and 16-1. Similarly, when the second-level wiring layer 16-1 is patterned, if mask displacement falls within a range of $\pm\Delta\alpha$, the reliable contact can be obtained between them. Furthermore, it is only the contact hole 14 that requires the margin $\Delta\alpha$, and the first-level wiring layers 12-1 and 12-2 and second-level wiring layers 16-1 and 16-2 can be formed so as to have the minimum width and the minimum pitch which are determined on the basis of the design rule. Consequently, a semiconductor device having the contact structure suitable for high-degree of integration can be manufactured.

In the foregoing first embodiment, the first-level wiring layers 12-1 and 12-2 and the second-level wiring layers 16-1 and 16-2 cross at right angles. However, even if they are arranged in parallel with each other as shown in FIGS. 10, 11, 12A and 12B, the same advantage can be obtained.

Figure 10:
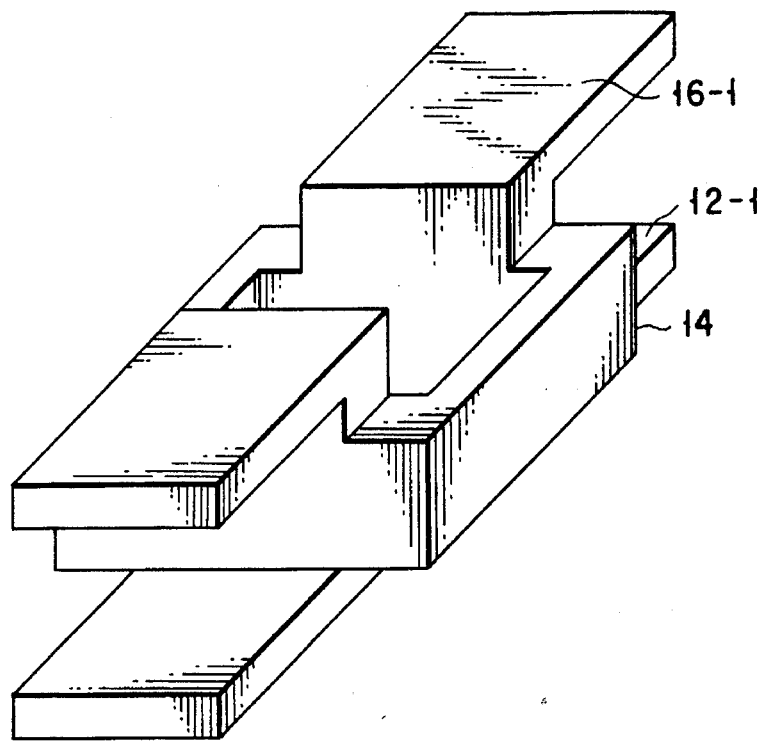
FIG. 10 is a perspective view of a contact portion between a first-level wiring layer and a second-level wiring layer of a modification to the semiconductor integrated circuit device of the first embodiment shown in FIG. 3.
Figure 11:
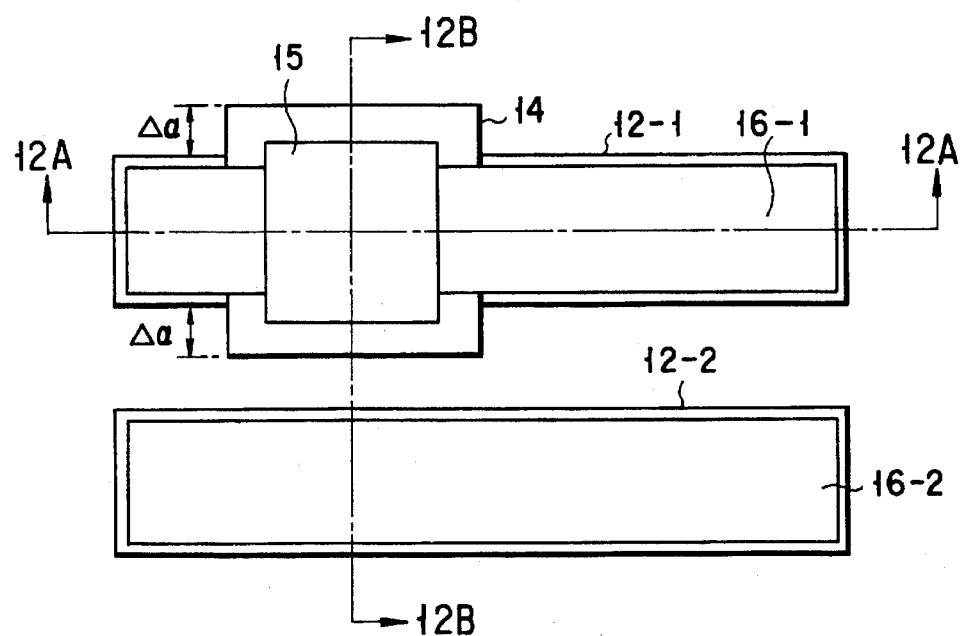
FIG. 11 is a pattern plan view of the contact portion shown in FIG. 10.
Figure 12A:
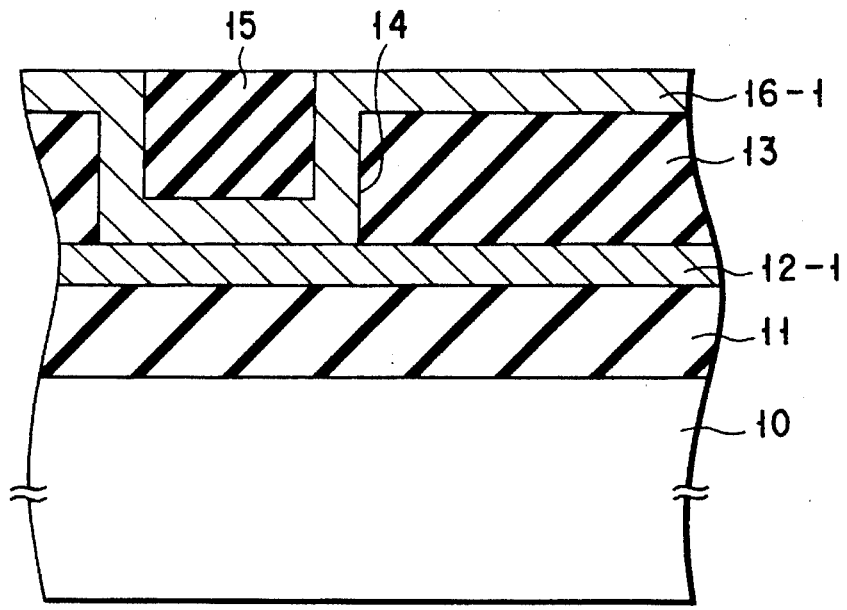
FIG. 12A is a cross-sectional view taken along the line 12A—12A of FIG. 11.
Figure 12B:
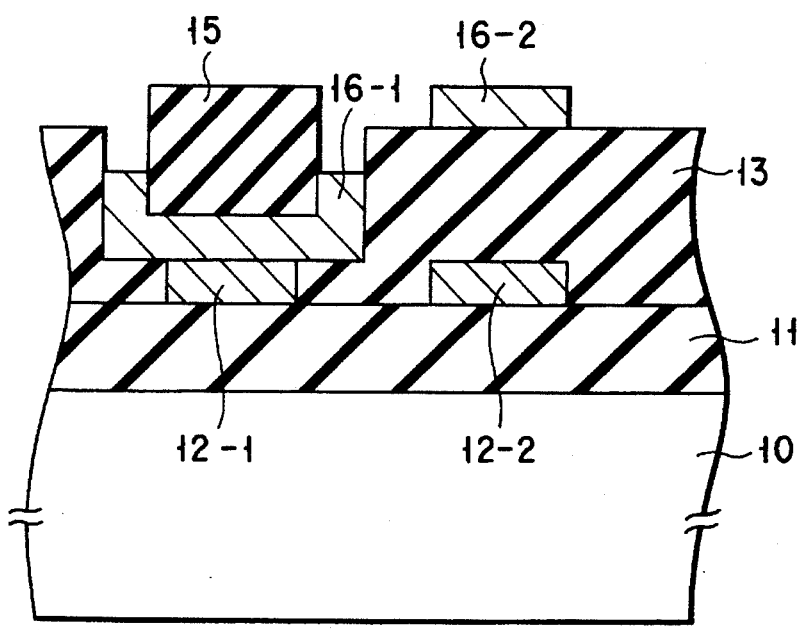
FIG. 12B is a cross-sectional view taken along the line 12B—12B of FIG. 11.

FIG. 10 is a perspective view of the structure of a contact portion between first- and second-level wiring layers 12-1 and 16-1 of a semiconductor integrated circuit device, FIG. 11 is a pattern plan view of the contact portion shown in FIG. 10, FIG. 12A is a cross-sectional view taken along the line 12A—12A of FIG. 11, and FIG. 12B is a cross-sectional view taken along the line 12B—12B. In FIGS. 10, 11, 12A and 12B, the same structural elements as those of FIGS. 3, 4, 5A and 5B are denoted by the same reference numerals, and their detailed description is omitted.

Figure 13:
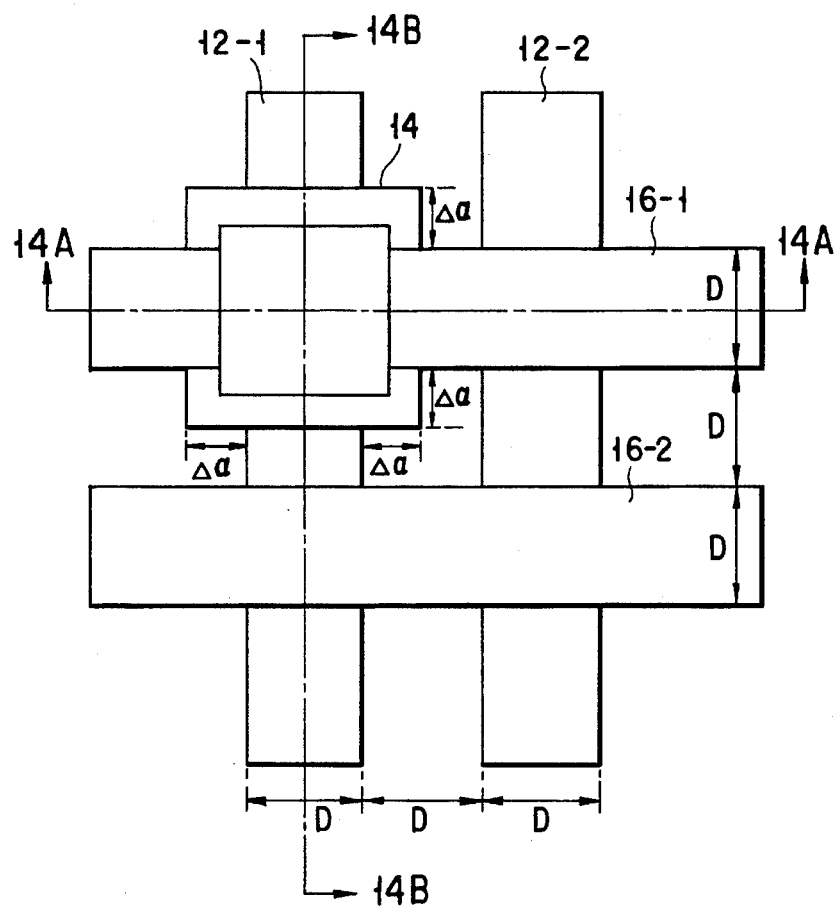
FIG. 13 is a pattern plan view of a contact portion of a semiconductor device according to a second embodiment of the present invention.
Figure 14A:
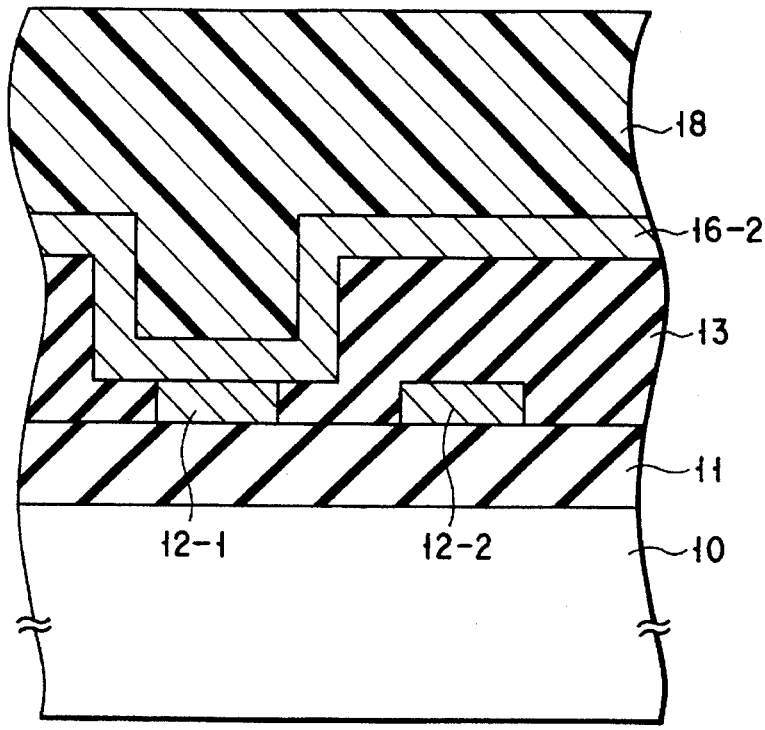
FIG. 14A is a cross-sectional view taken along the line 14A—14A of FIG. 13 and showing a process of manufacturing the semiconductor device of the second embodiment.
Figure 14B:
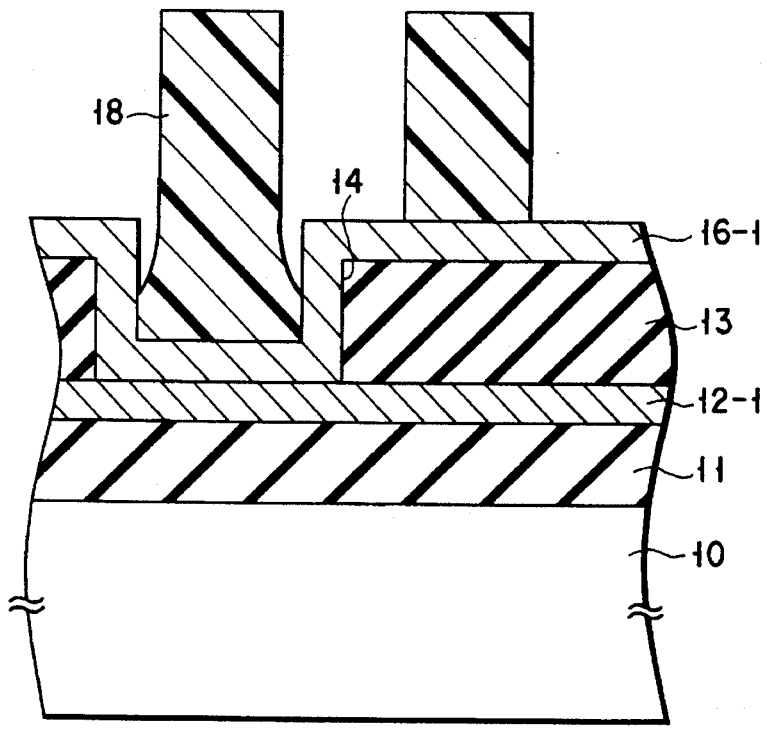
FIG. 14B is a cross-sectional view taken along the line 14B—14B of FIG. 13 and showing a process of manufacturing the semiconductor device of the second embodiment.

FIGS. 13, 14A and 14B are views for explaining a semiconductor device according to a second embodiment of the present invention. FIG. 13 is a pattern plan view of a contact portion of the semiconductor device, FIG. 14A is a cross-sectional view taken along the line 14A—14A of FIG. 13 and showing a process of manufacturing the semiconductor device, and FIG. 14B is a cross-sectional view taken along the line 14B—14B of FIG. 13 and showing a process of manufacturing the semiconductor device.

In the first embodiment, the contact hole 14 is filled with the insulative filler 15, whereas in the second embodiment, it is not filled with any insulative filler.

In the second embodiment, the step of forming a conductive layer as a second-level wiring layer, that is, the steps shown in FIGS. 6A, 6B, 7A and 7B through the step of forming a conductive layer, are the same as those of the first embodiment. After the formation of the conductive layer, as shown in FIGS. 14A and 14B, the contact hole 14 is not filled with an insulative filler, but photoresist 18 is applied thereto, and treatment such as exposure and development is carried out to form a mask for patterning second-level wiring layers 16-1 and 16-2. Using the photoresist 18 as a mask, the conductive layer is patterned by anisotropic etching such as RIE to form second-level wiring layers 16-1 and 16-2.

In the above manufacturing method according to the second embodiment, as illustrated in FIG. 14B, since an interval between photoresist 18 and contact hole 14 is considerably smaller than the minimum dimension, it does not exceed the resolution limit in the lithography process, with the result that an unexposed portion remains. The unexposed portion prevents a bottom region of the contact hole 14 on the second-level wiring layer 16-2 from being etched. Therefore, the contact hole 14 need not be filled with an insulative filler 15 but can be filled with the photoresist 18 when the second-level wiring layers 16-1 and 16-2 are formed. The same patterning can thus be achieved as in the case of using the filler 15.

Even though the thickness $\Delta T$ of the second-level wiring layer 16-1 is considerably increased compared with each of the widths W1 and W2 of the contact hole 14 in accordance with an improvement in degree of integration, the hole 14 need not be filled with the insulative filler 15. The reason is as follows. If "$2\Delta T$, which is two times the thickness $\Delta T$ of the second-level wiring layer 16-1, is larger than each of the widths W1 and W2 ($2\Delta T \geq W1$, $2\Delta T \geq W2$), the contact hole 14 is filled with the second-level wiring layer 16-1 when a conductive layer serving as the layer 16-1 is formed, as shown in FIGS. 15A and 15B.

Consequently, the same advantage as that of the first embodiment can be obtained from the constitution and manufacture method of the semiconductor device of the second embodiment shown in FIGS. 13, 14A, 14B, 15A and 15B.

Needless to say, the second embodiment can also be applied to the contact portions between the first-level wiring layers 12-1 and 12-2 and the second-level wiring layers 16-1 and 16-2 arranged in parallel with each other, as in the first embodiment shown in FIGS. 10, 11, 12A and 12B.

Figure 16A:
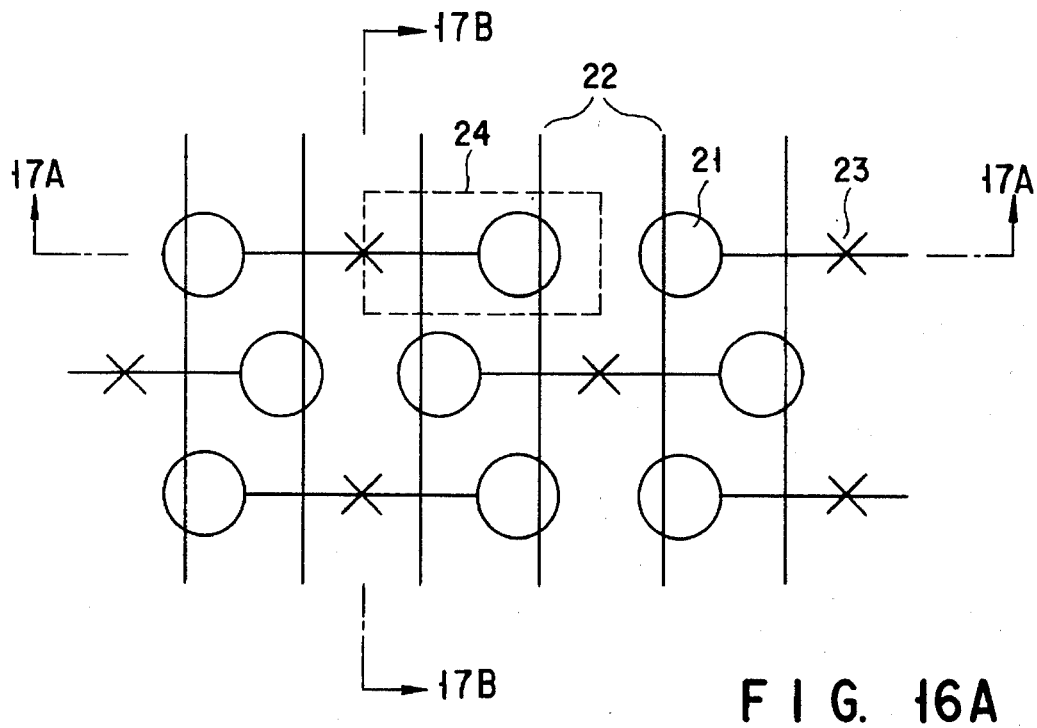
FIG. 16A is a plan view schematically showing the arrangement of memory cells of a DRAM having a bit-line contact portion to which the present invention is applied, for explaining a semiconductor device according to a third embodiment of the present invention.

An example of applying the present invention to a bit-line contact portion of a DRAM, will now be described. FIG. 16A schematically shows the arrangement of memory cells of the DRAM to explain a semiconductor device according to a third embodiment of the present invention. As illustrated in FIG. 16A, word lines 22 are arranged in parallel and at regular intervals, and each bit-line contact portion 23 is interposed adjacent capacitors 21. A region 24 surrounded with a broken line corresponds to one unit of cell.

IEDM Technical Digest, 1993, pp. 627–630 describes a 256 Mbit BEST (Buried Strap) cell as a cell structure of the DRAM.

Figure 16B:
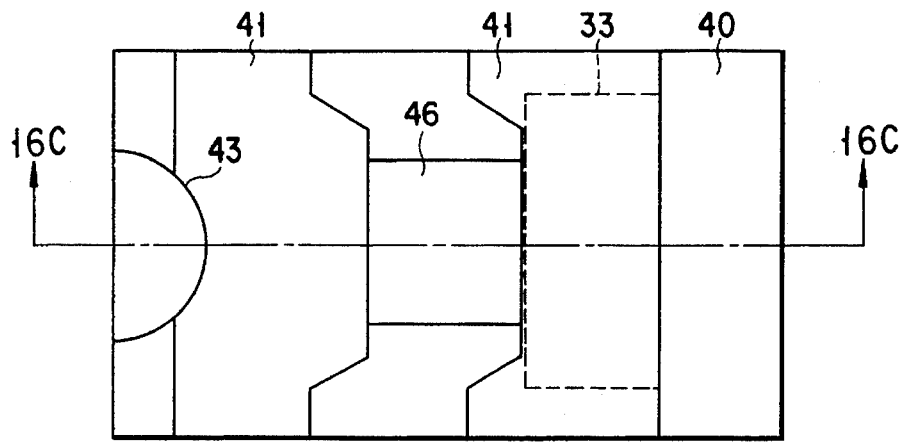
FIG. 16B is a pattern plan view of one cell unit, for explaining a BEST (Buried Strap) cell as one example of the memory cells shown in FIG. 16A.
Figure 16C:
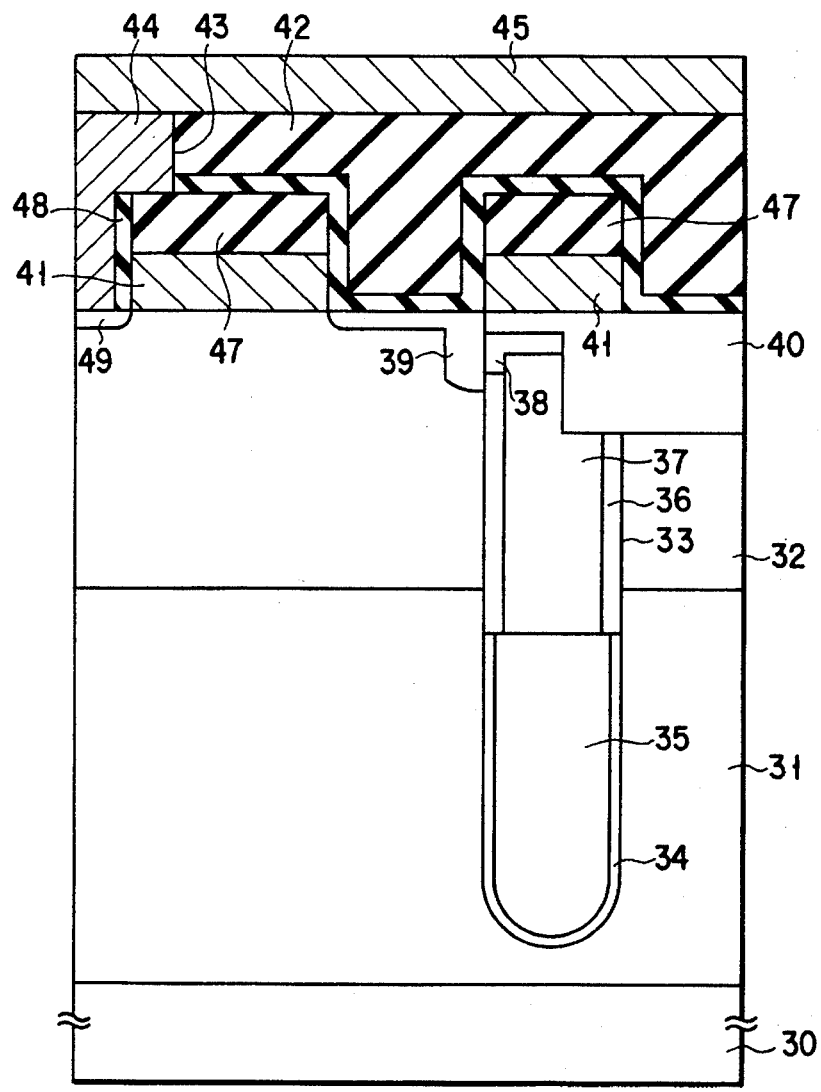
FIG. 16C is a cross-sectional view taken along the line 16C—16C of FIG. 16B.

The BEST cell will be described in brief, with reference to FIGS. 16B and 16C. FIG. 16B is a pattern plan view showing one unit of cell, and FIG. 16C is a cross-sectional view taken along the line 16C—16C of FIG. 16B. A burial N-well region 31 is formed on a surface region of a semiconductor substrate 30, and a P-well region 32 is formed on a surface region of the N-well region 31. A trench 33 is formed so as to extend from the surface of the P-well region 32 into the N-well region 31. A layered film (ON film) 34 of an oxide film and a nitride film is formed in the vicinity of a bottom portion of the trench 33. A first $N^+$-type polysilicon layer 35 is buried in the bottom portion of the trench 33. An oxide film collar 36 is provided on the upper side wall portion of the trench 33. A second $N^+$-type polysilicon layer 37 is buried in the trench 33 on the polysilicon layer 35. A third $N^+$-type polysilicon layer 38 is buried in the uppermost portion of the trench 33. A burial strap 39 is formed so as to extend from a surface region of the P-well region toward the side wall portion of the trench 33. Gate electrodes (polysilicon layers) 41 serving as word lines are formed on the P-well region 32 and provided on an STI (Shallow Trench Isolation) 40 on the trench 33. SiN films 47 are formed on the gate electrodes 41. A spacer 48 of SiN film is formed on the gate electrodes 41, SiN films 47, and an exposed surface of the strap 39. An insulation film 42 of BPSG or the like is formed on the resultant structure. A bit-line contact portion 43 is provided in the insulation film 42 adjacent to the gate electrode 41 and filled with a fourth $N^+$-type polysilicon layer 44. An $N^-$-type diffusion layer 49 serving as a source/drain region is formed in the P-well region 32 on the bottom of the contact portion 43. A bit line 45 is formed on the insulation film 42 and electrically connected to the diffusion layer 49 through the polysilicon layer 44. A region between the gate electrode 41 and trench 33 is used as an active region 46.

The BEST cell having the above constitution is manufactured through the following process. First a burial N well region 31 and a P-well region 32 are formed in a semiconductor substrate 30, and then a trench 33 is formed in the substrate 30. An ON (oxide/nitride) film 34 is formed on the inner wall of the trench 33, and the trench is filled with a first $N^+$-type polysilicon layer 35, thus forming a capacitor in which the ON film 34 serves as a capacitor insulation film and the $N^+$-type polysilicon layer 35 and burial N-well region 31 serve as electrodes. After that, the polysilicon layer 35 is etched back below the interface between the P- and N-well regions 32 and 31, and an oxide film collar 36 is formed on the $N^+$-type polysilicon layer 35. A portion of the oxide film collar 36 located above the polysilicon layer 37 is removed by etching to form a third $N^+$-type polysilicon layer 38 and a burial strap 39. An STI 40 is formed, and a gate electrode (polysilicon) 41 serving as a word line is formed on the substrate through a gate insulation film (not shown). An insulation film 42 of BPSG or the like is formed on the resultant structure and its surface is planerized by a method such as reflow and CMP. Thereafter, a bit-line contact portion (contact hole) 43 is self-aligned with the gate electrode 41, and the contact hole is filled with a fourth $N^+$-type polysilicon layer 44. A conductive layer is formed on the insulation film 42 to form a bit line 45 by patterning. The bit line 45 is electrically connected to an $N^+$-type diffusion layer 49, serving as a source/drain region, through the polysilicon layer 44.

The application of the present invention to the bit-line contact portion of the DRAM shown in FIGS. 16B and 16C, will be described in detail, with reference to FIGS. 17A through 20B. The bit-line contact portion is common to two adjacent cells, and two selective MOS transistors connected to the bit-line contact portion are shown. FIGS. 17A, 18A, 19A and 20A are cross-sectional views taken along the line 17A—17A of FIG. 16A and showing steps of forming the bit-line contact portion, and FIGS. 17B, 18B, 19B and 20B are cross-sectional views taken along the line 17B—17B of FIG. 16A and showing steps of forming the bit-line contact portion.

As shown in FIGS. 17A and 17B, the same process as that shown in FIGS. 16B and 16C is executed up to the step of forming the STI 40. After this step, a gate insulation film (not shown) is formed on a P-well region 32, and then an $N^+$-type polysilicon layer and a SiN film are formed in sequence on the gate insulation film, thus forming a gate electrode 41 by patterning. A SiN film 47 remains on the gate electrode 41. Using the gate electrode 41 and SiN film 47 as a mask, impurities are ion-implanted into the P-well region 32 to form an $N^-$-type diffusion layer 49 serving as a source/drain region. After that, a spacer 48 of SiN film is formed on the side wall portions of the gate electrode 41 and SiN film 47. A BPSG film 42 is deposited on the resultant structure and its surface is planerized (see FIGS. 18A and 18B). The BPSG film 42 and SiN film 47 are selectively etched by the RIE using a mask thereby to form a bit-line contact portion (contact hole) 50. Subsequently a film 45 of tungsten or a layered film 45 that of tungsten/titanium/nitride is formed on the resultant structure (FIGS. 19A and 19B).

In the subsequent manufacturing step, as in the first embodiment described above, the bit-line contact portion 50 is filled with SOG 51, and the layered film is patterned by the RIE using photoresist 52 as a mask, thereby forming a bit line 45 (FIGS. 20A and 20B).

In the third embodiment, as shown in FIGS. 21A and 21B, the bit line 45 can be formed by patterning, without filling the bit-line contact portion 50, as in the second embodiment.

FIG. 22 shows the bit-line contact portion 50 which is over-etched in the etching step of the insulation film 42 after the step shown in FIG. 18B. If the bit line 45 is formed with the contact portion over-etched, it will be short-circuited with the exposed P-well region 32. To prevent this short circuit, in the fifth embodiment shown in FIG. 23, the $N^-$-type diffusion layer (source/drain region) 49 is deeply formed in advance in view of over-etching.

Figure 24:
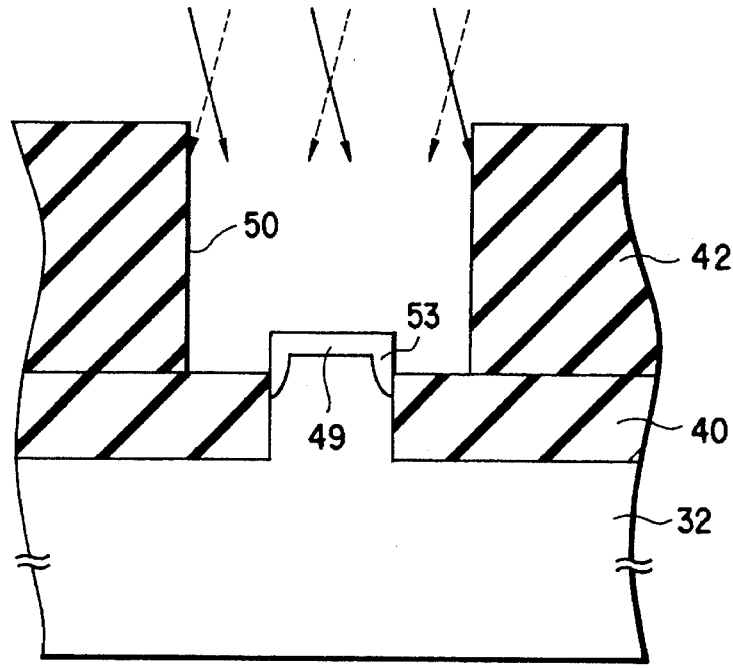
FIGS. 24 and 25 are cross-sectional views showing some of steps of manufacturing a semiconductor device according to a sixth embodiment of the present invention, which prevents a short circuit from being caused between a bit line and a P-well region.
Figure 25:
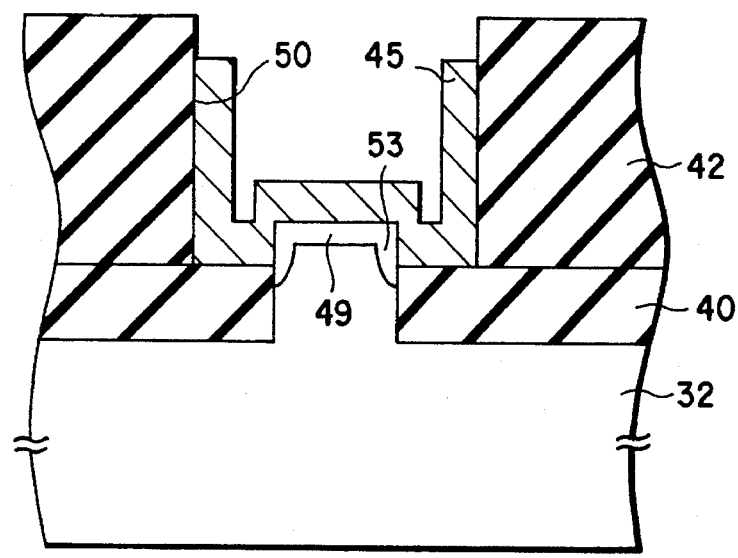

FIGS. 24 and 25 show steps of manufacturing a semiconductor device according to a sixth embodiment of the present invention, which prevents a short circuit from being caused between the bit line 45 and P-well region 32. As shown in FIG. 24, ions are implanted diagonally two times in the contact portion 50, as indicated by the solid and broken lines, and the $N^-$-type diffusion layer 49 is formed on the side wall portion of the P-well region 32 as well as on the upper surface of a projecting portion thereof. Consequently, the short circuit can be prevented since an $N^-$-type diffusion layer 53 is interposed between the bit line 45 and the exposed portion of P-well region 32.

As described above, in the contact portion between the wiring layers and the method of forming the same according to the present invention, the width of each of the first- and second-level wiring layers 12-1, 12-2, 16-1 and 16-2 and the interval between them can be set to the minimum dimension D determined on the basis of the design rule, as shown in FIG. 4. The wiring pitch, which is an index of degree of integration, is 2D and thus suitable for high degree of integration. The mask alignment margin $\Delta\alpha$ for forming the contact hole 14 is set to uniform the contact resistance, that is, the contact area between the first- and second-level wiring layers and does not have any influence on the wiring pitch. Since, in the second embodiment, the manufacturing process can be made simpler than that of the first embodiment, a low-cost semiconductor device can be obtained. If the present invention is applied to a DRAM as in the third embodiment, the most advance device is achieved and thus the greater advantages of high degree of integration and low cost can be obtained. The fifth embodiment produces an effect of preventing a short circuit from being caused between the bit line and P-well region, and the sixth embodiment produces a special effect of preventing a short circuit from being caused between them without increasing diffusion depth Xj of the $N^-$-type diffusion layer.

The present invention is not limited to the foregoing embodiments. It is needless to say that various changes and modifications can be made without departing from the scope of the subject matter of the present invention.

As described above, according to the present invention, a semiconductor device having a contact portion between wiring layers suitable for high degree of integration, and a method for manufacturing the same can be obtained.

What is claimed is:

1. A semiconductor device comprising:
    a first-level wiring layer;
    a first insulating film formed on said first-level wiring layer;
    a contact hole formed in said first insulating film to expose a portion of said first-level wiring layer; and
    a second-level wiring layer electrically connected to said first-level wiring layer by an open box-shaped contact formed in said contact hole, said second-level wiring layer including a first portion formed on said first insulating film and connected to a first sidewall portion of said open box-shaped contact, and a second portion formed on said first insulating film and connected to a second sidewall portion of said open-box-shaped contact.

2. The semiconductor device according to claim 1, wherein said first-level wiring layer is formed on a second insulating film.

3. The semiconductor device according to claim 1, further comprising a third insulating film which is formed in the opening of said open box-shaped contact.

4. The semiconductor device according to claim 1, wherein said first-level wiring layer is formed to extend in a first direction, said second-level wiring layer is formed to extend in a second direction so as to intersect said first-level wiring layer, and said open box-shaped contact is formed at the intersection of said first-level wiring layer and said second-level wiring layer.

5. The semiconductor device according to claim 1, wherein said first-level wiring layer and said second-level wiring layer are formed to extend parallel with each other, and said open box-shaped contact is formed at an overlapping portion of said first-level wiring layer and said second-level wiring layer.

6. A semiconductor device comprising:
    a plurality of first-level wiring layers formed in a first direction and in parallel with one another;
    a plurality of second-level wiring layers formed in a second direction perpendicular to the first direction and in parallel with one another;
    a first insulation film interposed between said plurality of first-level wiring layers and said plurality of second-level wiring layers; and
    a contact hole formed in a portion of said first insulation film at at least one intersection of said plurality of first-level wiring layers and said plurality of second-level wiring layers, to a depth reaching an upper surface of said first-level wiring layer, a side of said contact hole parallel with the first direction being longer than a width of said second-level wiring layer and shorter than a length two times an interval between said plurality of second-level wiring layers plus the width of said second-level wiring layer, a side of said contact hole parallel with the second direction being longer than a width of said first-level wiring layer and shorter than a length two times an interval between said plurality of first-level wiring layers plus the width of said first-level wiring layer, and said second-level wiring layer being formed at least on a side wall and a bottom portion of said contact hole, thereby electrically connecting said second-level wiring layer to said first-level wiring layer at the bottom portion of said contact hole.

7. The semiconductor device according to claim 6, wherein said plurality of first-level wiring layers are formed on a second insulation film.

8. The semiconductor device according to claim 6, further comprising a third insulation film which is buried in said second-level wiring layer in said contact hole.

9. The semiconductor device according to claim 6, wherein said second-level wiring layer is formed by filling said contact hole.

10. A semiconductor device comprising:

a plurality of first-level wiring layers formed in parallel with one another;

a plurality of second-level wiring layers formed in parallel with one another along said plurality of first-level wiring layers;

a first insulation film interposed between said plurality of first-level wiring layers and said plurality of second-level wiring layers; and a contact hole formed in a portion of said first insulation film at least one overlap portion of said plurality of first-level wiring layers and said plurality of second-level wiring layers, to a depth reaching an upper surface of said first-level wiring layer, a side of said contact hole perpendicular to said plurality of first-level wiring layers and said plurality of second level wiring layers being longer than a width of said plurality of first-level wiring layers and said plurality of second-level wiring layers and shorter than a length two times an interval between said plurality of first-level wiring layers and said plurality of second-level wiring layers plus the width of said plurality of first-level wiring layers and said plurality of second-level wiring layers, and said second-level wiring layer being formed at least on a side wall and a bottom portion of said contact hole, thereby electrically connecting said second-level wiring layer to said first-level wiring layer at the bottom portion of said contact hole.

11. The semiconductor device according to claim 10, wherein said plurality of first-level wiring layers are formed on a second insulation film.

12. The semiconductor device according to claim 10, further comprising a third insulation film which is buried in said second-level wiring layer in said contact hole.

13. The semiconductor device according to claim 10, wherein said second-level wiring layer is formed by filling said contact hole.

14. A semiconductor device comprising:

element isolation films formed on a semiconductor substrate;

a plurality of gate electrodes formed on a surface of said semiconductor substrate through a gate insulation film and connected to a word line;

source/drain regions formed in said semiconductor substrate on sides of said plurality of gate electrodes;

an insulation film coating said source/drain regions;

a contact hole formed in said insulation film above one of said source/drain regions so as to include part of said plurality of gate electrodes and part of said element isolation film;

a bit line connected to the one of said source/drain regions and coating a side wall and a bottom of said contact hole, a width of said bit line on said insulation film being smaller than a diameter of said contact hole; and a capacitor electrically connected to another of said source/drain regions.

15. The semiconductor device according to claim 14, wherein an upper surface of said source/drain regions is higher in level than an upper surface of said element isolation film, and a depth of said source/drain regions is greater than that of a step portion formed by a difference in level between the upper surface of said source/drain regions and the upper surface of said element isolation film.

16. The semiconductor device according to claim 14, wherein an upper surface of said source/drain regions is higher in level than an upper surface of said element isolation film, a depth of said source/drain regions is smaller than that of a step portion formed by a difference in level between the upper surface of said source/drain regions and the upper surface of said element isolation film, and said source/drain regions extend onto a side wall of the step portion.

17. The semiconductor device according to claim 1, wherein a size of said contact hole in a direction parallel to a width of said first-level wiring layer is larger than the width of said first-level wiring layer.

18. The semiconductor device according to claim 1, wherein said open box-shaped contact is part of said second wiring layer.

19. A semiconductor device, comprising:

a first conductive layer;

an insulating layer formed on said first conductive layer;

a second conductive layer formed on said insulating layer; and a contact formed in a contact hole in said insulating layer for electrically connecting said first conductive layer and said second conductive layer, a size of said contact hole in a direction parallel to a width of said first conductive layer being greater than the width of said first conductive layer and a size of said contact hole in a direction parallel to a width of said second conductive layer being greater than the width of said second conductive layer.

20. The semiconductor device according to claim 19, wherein said first conductive layer comprises a first wiring layer and said second conductive layer comprises a second wiring layer.

21. The semiconductor device according to claim 20, wherein said contact fills said contact hole.

22. The semiconductor device according to claim 20, wherein said contact comprises a first wall in contact with said second conducting layer and a second wall in contact with said insulating layer, said first and second walls defining an open interior region therebetween.

23. The semiconductor device according to claim 22, wherein said second wiring layer includes a first portion connected to a first portion of said second wall and a second portion connected to a second portion of said second wall.

24. The semiconductor device according to claim 21, wherein said second wall comprises four wall portions.

25. The semiconductor device according to claim 24, wherein said four wall portions comprise first and second pairs of opposed wall portions.

26. The semiconductor device according to claim 20, wherein said first wiring layer is perpendicular to said second wiring layer.

27. The semiconductor device according to claim 20, wherein said first wiring layer is parallel to said second wiring layer.

28. The semiconductor device according to claim 20, wherein the width of said first wiring layer is W1 and the dimension of said contact hole in a direction parallel to the width of said first wiring layer is $W1+2\Delta\alpha$, where $\Delta\alpha$ is a mask alignment margin for forming said contact.

29. The semiconductor device according to claim 20, wherein the width of said second wiring layer is W2 and the dimension of said contact hole in a direction parallel to the width of said second wiring layer is $W2+2\Delta\alpha$, where $\Delta\alpha$ is a mask alignment margin for forming said contact.

30. The semiconductor device according to claim 19, wherein said first conductive layer is a diffusion region.

31. A semiconductor device, comprising:

a semiconductor substrate;

a memory cell formed on said semiconductor substrate, said memory cell comprising:
   a switching transistor comprising source and drain regions formed in said semiconductor substrate and spaced apart by a channel region and a gate electrode insulatively spaced from said channel region; and
   a capacitor electrically connected to one of said source and drain regions;

an insulating layer formed over said source and drain regions; and a bit line electrically connected to the other of said source and drain regions by a bit line contact formed in a contact hole in said insulating layer, a dimension of said contact hole in a direction parallel to a width of said bit line being greater than the width of said bit line.

32. The semiconductor device according to claim 31, wherein said capacitor is a trench cell capacitor.

33. The semiconductor device according to claim 31, wherein said bit line contact fills said contact hole.

34. The semiconductor device according to claim 31, wherein said bit line contact comprises a first wall in contact with the other of said source and drain regions and a second wall in contact with said insulating layer, said first and second walls deforming an open interior region therebetween.

35. A semiconductor device, comprising:

first wiring layers each having a width D and formed with a spacing D therebetween;

an insulating layer formed on said first wiring layers;

second wiring layers each having a width D and formed on said insulating film with a spacing D therebetween; and a contact formed in a contact hole in said insulating layer for electrically connecting one of said first wiring layers and one of said second wiring layers, a dimension of said contact hole in a direction parallel to the width D of said one first wiring layer being $D+2\Delta\alpha$ and a dimension of said contact hole in a direction parallel to the width D of said one second wiring layer being $D+2\Delta\alpha$, where $\Delta\alpha$ is an alignment margin for forming said contact.

36. The semiconductor device according to claim 35, wherein said contact fills said contact hole.

37. The semiconductor device according to claim 35, wherein said contact comprises a first wall in contact with said second conducting layer and a second wall in contact with said insulating layer, said first and second walls defining an open interior region therebetween.

* * * * *